(12) United States Patent
Ikeda et al.

(10) Patent No.: US 7,993,945 B2
(45) Date of Patent: Aug. 9, 2011

(54) METHOD FOR MANUFACTURING LIGHT-EMITTING DEVICE

(75) Inventors: Hisao Ikeda, Kanagawa (JP); Takahiro Ibe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 79 days.

(21) Appl. No.: 12/420,183

(22) Filed: Apr. 8, 2009

(65) Prior Publication Data

US 2009/0280589 A1    Nov. 12, 2009

(30) Foreign Application Priority Data

Apr. 11, 2008   (JP) ................................ 2008-103425

(51) Int. Cl.
  *H01L 21/00*   (2006.01)
  *H01L 21/20*   (2006.01)
(52) U.S. Cl. ........................ 438/29; 438/478; 438/584
(58) Field of Classification Search .................. None
    See application file for complete search history.

(56) References Cited

U.S. PATENT DOCUMENTS

| | | | |
|---|---|---|---|
| 5,937,272 A | 8/1999 | Tang | |
| 6,165,543 A | 12/2000 | Otsuki et al. | |
| 6,283,060 B1 | 9/2001 | Yamazaki et al. | |
| 6,689,492 B1 | 2/2004 | Yamazaki et al. | |
| 6,703,179 B2 | 3/2004 | Tyan | |
| 6,776,847 B2 | 8/2004 | Yamazaki et al. | |
| 7,316,983 B2 | 1/2008 | Yamazaki et al. | |
| 7,763,320 B2 | 7/2010 | Yamazaki et al. | |
| 2004/0065902 A1 | 4/2004 | Yamazaki et al. | |
| 2005/0005848 A1 | 1/2005 | Yamazaki et al. | |
| 2005/0145326 A1 | 7/2005 | Hatwar | |
| 2006/0243377 A1 | 11/2006 | Matsuo et al. | |
| 2006/0246240 A1 | 11/2006 | Matsuda et al. | |
| 2008/0299496 A1 | 12/2008 | Hirakata et al. | |
| 2009/0104403 A1 | 4/2009 | Aoyama et al. | |
| 2009/0269485 A1 * | 10/2009 | Ikeda et al. | ............. 427/66 |

FOREIGN PATENT DOCUMENTS

| | | |
|---|---|---|
| JP | 2000-256877 | 9/2000 |
| JP | 2003-313654 | 11/2003 |
| JP | 2004-103406 | 4/2004 |
| JP | 2006/309995 | 11/2006 |
| JP | 2006-344459 | 12/2006 |
| WO | WO 2005/069398 A2 | 7/2005 |

OTHER PUBLICATIONS

Urabe, T. et al, "13.1: Invited Paper: Technological Evolution for Large Screen Size Active Matrix OLED Display," SID Digest '07: SID International Symposium Digest of Technical Papers, vol. 38, 2007, pp. 161-164.

* cited by examiner

*Primary Examiner* — Scott B Geyer
(74) *Attorney, Agent, or Firm* — Husch Blackwell LLP

(57) ABSTRACT

An object is to provide a method for manufacturing a light-emitting device with high definition, high light-emitting characteristics, and the long lifetime by employing a method in which a desired evaporation pattern can be formed and an excess evaporation of a material layer which is to be the transfer layer is prevented and in which deterioration of the material or the like is hard to occur in a transfer step. This is a method for manufacturing a light-emitting device, in which irradiation with first light is performed to pattern a material layer over a first substrate which is an evaporation donor substrate and irradiation with second light is performed to evaporate the material layer patterned onto a second substrate which is a deposition target substrate.

20 Claims, 14 Drawing Sheets

FIG. 9A
FIG. 9C
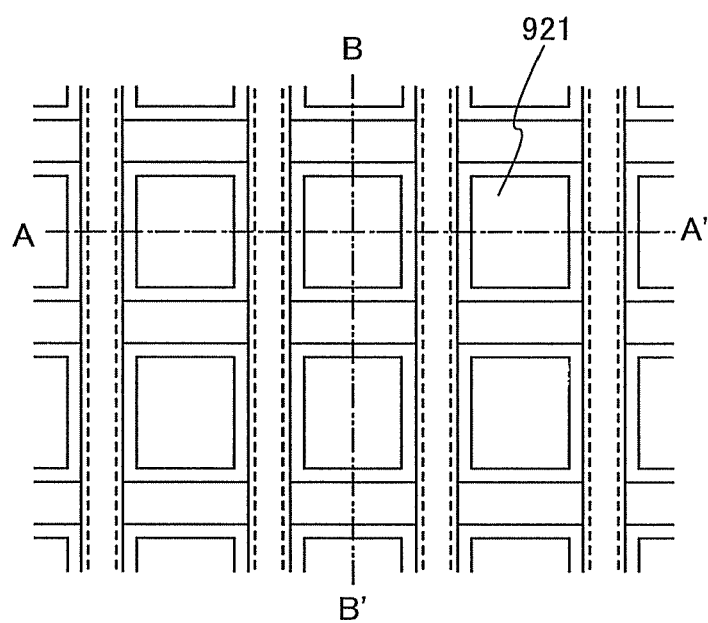
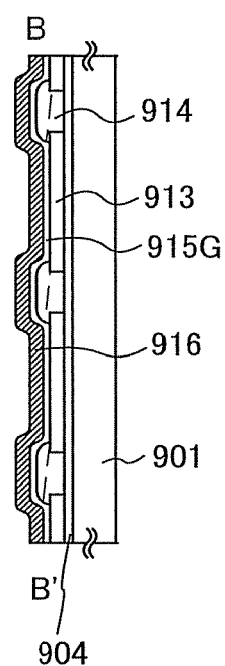
FIG. 9B
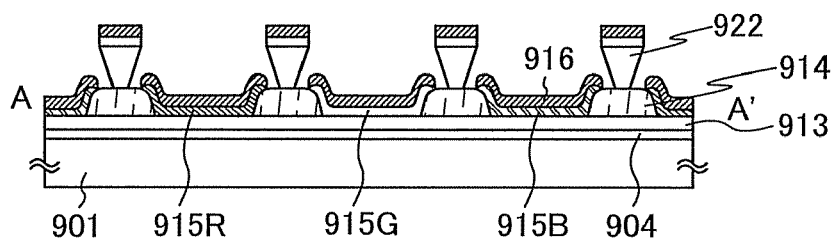

METHOD FOR MANUFACTURING LIGHT-EMITTING DEVICE

BACKGROUND OF THE INVENTION

1. Field of the Invention

The present invention relates to a method for manufacturing a light-emitting device using an evaporation method.

2. Description of the Related Art

Light emitting elements, which use organic compounds as a light emitting member and are characterized by the thinness, lightweight, fast response, and direct current low voltage driving, are expected to be applied to next-generation flat panel displays. Among display devices, ones having light emitting elements arranged in matrix are considered to be particularly superior to conventional liquid crystal display devices for their wide viewing angle and excellent visibility.

It is said that, as for a light-emitting mechanism of a light-emitting element, an EL layer is sandwiched between a pair of electrodes and voltage is applied to the EL layer, and thus electrons injected from a cathode and holes injected from an anode are recombined in an emission center of the EL layer to form molecular excitons, and the molecular excitons release energy when returning to a ground state; thus, light is emitted. A singlet excited state and a triplet excited state are known as excited states, and it is thought that light emission can be obtained through either of the excitation states.

An EL layer included in a light-emitting element includes at least a light-emitting layer. In addition, the EL layer can have a stacked-layer structure including a hole-injecting layer, a hole-transporting layer, an electron-transporting layer, an electron-injecting layer, and/or the like, in addition to the light-emitting layer.

In addition, an EL material for forming an EL layer is roughly classified into a low molecular (monomer) material and a high molecular (polymer) material. In general, a film of a low molecular material is often formed by an evaporation method and a film of a high molecular material is often formed by an inkjet method or the like.

An evaporation apparatus which is used in an evaporation method has a substrate holder to which a substrate is mounted; a crucible (or an evaporation boat) containing an EL material, that is, an evaporation material; a heater for heating the EL material in the crucible; and a shutter for preventing the EL material from being scattered during sublimation. The EL material which is heated by the heater is sublimated and deposited onto the substrate.

Note that in order to achieve uniform deposition, actually, a deposition target substrate needs to be rotated and the substrate and the crucible need to be separated from each other by at least a certain distance. In addition, when films of different colors are separately formed using a plurality of EL materials through a mask such as a metal mask, it is necessary that the distance between pixels be designed to be large and that the width of a partition (bank) formed of an insulator between pixels be large. Such needs are major problems in advancing high definition (increasing the number of pixels) and miniaturization of pixel pitches along with downsize of a light-emitting device including a light-emitting element.

Therefore, as for flat panel displays, it has been necessary to achieve high productivity and cost reduction as well as to solve those problems in order to achieve higher definition and higher reliability.

Thus, a method for forming an EL layer of a light emitting element through laser thermal transfer has been proposed (see Reference 1: Japanese Published Patent Application No. 2006-309995). Reference 1 discloses a transfer substrate which has a photothermal conversion layer including a low-reflective layer and a high-reflective layer and also a transfer layer over a supporting substrate. Irradiation of such a transfer substrate with a laser light allows the transfer layer to be transferred to an element-forming substrate.

SUMMARY OF THE INVENTION

However, when the transfer substrate in which the transfer layer is formed over the high-reflective layer and the low-reflective layer is irradiated with a to transfer the transfer layer onto the deposition target substrate directly as described in Reference 1, heat generated in the low-reflective layer is conducted to the high-reflective layer if the irradiation time with a laser light is long, whereby not only part of the transfer layer which is over the low-reflective layer but also part of the transfer layer which is over the high-reflective layer is highly likely to be transferred. In contrast, when irradiation with a laser light with high output power is performed instantaneously in order to shorten irradiation time with the laser beam, although only the part of the transfer layer which is over the low-reflective layer is transferred and a desired evaporation pattern can be formed, the transfer layer has a high temperature at the moment that irradiation with the laser light is performed, whereby decomposition or deterioration of a material included in the transfer layer might occur. Further, after the transfer, the resulting film formed in this manner is likely to be very uneven and poor in its film quality.

Therefore, an object of one embodiment of the present invention is to provide a method for manufacturing a light-emitting device with high definition, high light-emitting characteristics, and the long lifetime by applying a method in which a desired evaporation pattern can be formed and an excess evaporation of a material layer which is to be the transfer layer is prevented and in which deterioration of the material or the like is hard to occur in a transfer step.

One embodiment of the present invention is a method for manufacturing a light-emitting device, in which irradiation with first light is performed to pattern a material layer over a first substrate which is an evaporation donor substrate and irradiation with second light is performed to evaporate the material layer, which has been patterned, onto a second substrate which is a deposition target substrate.

A structure of one embodiment of the present invention is a method for manufacturing a light-emitting device in which a reflective layer which has an opening portion is formed over one surface of a first substrate; a light absorption layer is formed so as to be in contact with the first substrate and the reflective layer; a material layer is formed so as to be in contact with the light absorption layer; and the opposite surface of the first substrate is irradiated with the first light in a range of the following general formula (1), where light intensity is $A_1$ (W/cm$^2$) and irradiation time is $B_1$ (s).

$$1/(A_1)^{1.5} \leq B_1 \leq 10^6/(A_1)^{1.5} \text{ and } B_1 \leq 10^{-3} \tag{1}$$

With the irradiation with the first light, part of the material layer which overlaps with the opening portion of the reflective layer is removed; the one surface of the first substrate and a deposition target surface of the second substrate are disposed so as to face each other and be brought close to each other; and the opposite surface of the first substrate is irradiated with the second light in a range of the following general formula (2), where light intensity is $A_2$ (W/cm$^2$) and irradiation time is $B_2$ (s).

$$1/(A_2)^{1.5} \leq B_2 \leq 10^6/(A_2)^{1.5} \text{ and } B_2 > 10^{-3} \tag{2}$$

With the irradiation with the second light, part of the material layer which overlaps with the reflective layer is evaporated onto the deposition target surface of the second substrate.

Further, another structure of one embodiment of the present invention is a method for manufacturing a light-emitting device, in which a reflective layer with an opening portion is formed over one surface of a first substrate; a light absorption layer is formed so as to be in contact with the first substrate and the reflective layer; a material layer is formed so as to be in contact with the light absorption layer; and the opposite surface of the first substrate is irradiated with first light in a range of the following general formula (1), where light intensity is $A_1$ (W/cm$^2$) and irradiation time is $B_1$ (s).

$$1/(A_1)^{1.5} \leq B_1 \leq 10^6/(A_1)^{1.5} \text{ and } B_1 \leq 10^{-3} \qquad (1)$$

With the irradiation with the first light, part of the material layer which overlaps with the opening portion of the reflective layer is removed; the one surface of the first substrate and a deposition target surface of a second substrate are disposed so as to face each other and be brought close to each other; the first substrate is heated; and part of the material layer which overlaps with the reflective layer is evaporated onto the deposition target substrate of the second substrate.

In each of the aforementioned structures, the first light is a laser light.

In each of the aforementioned structures, the reflective layer has a reflectance of greater than or equal to 85% with respect to light and contains any of aluminum, silver, gold, platinum, copper, an alloy containing aluminum, and an alloy containing silver.

In each of the aforementioned structures, the light absorption layer has a reflectance of less than or equal to 70% with respect to light and contains any of tantalum nitride, titanium nitride, chromium nitride, manganese nitride, titanium, and carbon.

In each of the aforementioned structures, the material layer is formed from an organic compound and contains one or both of a light-emitting material and a carrier-transporting material.

The present invention also covers an electronic device including a light-emitting device, as well as a light-emitting device including a light-emitting element. Accordingly, a light-emitting device in this specification refers to an image display device, a light-emitting device, and a light source (including an illumination device). In addition, light-emitting devices include all of the following modules: modules provided with a connector, for example, a flexible printed circuit (FPC), a tape automated bonding (TAB) tape, or a tape carrier package (TCP); modules provided with a printed wiring board at the end of a TAB tape or a TCP; and modules where an integrated circuit (IC) is directly mounted on a light-emitting element by a chip-on-glass (COG) method.

Light irradiation is performed twice in the method for manufacturing a light-emitting device related to one embodiment of the present invention, which enables pattern formation of the material layer over the evaporation donor substrate and deposition of the material layer onto the deposition target substrate. Specifically, the material layer formed over the evaporation donor substrate is patterned by the first light irradiation and the patterned material layer is evaporated onto the deposition target substrate by the second light irradiation, whereby the material layer can be evaporated with high accuracy. Therefore, the light-emitting device with high definition, high light-emitting characteristics, and the long lifetime can be manufactured.

Note that, since a light source which emits light having high intensity instantaneously is used in first light irradiation, irradiation time can be shortened and can prevent deformation of a pattern region due to heat conduction. Further, since the material layer over the evaporation donor substrate is patterned in the first light irradiation, a light source which emits light with lower intensity than that in the first light irradiation can be used in the second light irradiation regardless of heat conduction. Accordingly, deterioration of the material layer evaporated onto the deposition target substrate due to light irradiation can be prevented.

Note that, when lamp light is used as a light source in the second light irradiation, since a film can be deposited on a large area at one time, productivity of a light-emitting device can be improved. Further, in the present invention, by heating the evaporation donor substrate indirectly or directly instead of the second light irradiation, the evaporation material over the evaporation donor substrate may be sublimated and deposited onto the deposition target substrate.

BRIEF DESCRIPTION OF THE DRAWINGS

FIGS. 9A to 9C are views illustrating a passive-matrix light-emitting device.

DETAILED DESCRIPTION OF THE INVENTION

Hereinafter, the embodiments according to the present invention will be described in detail with reference to the drawings. However, the present invention is not limited to explanation to be given below, and it is to be easily understood that modes and details thereof can be variously modified without departing from the purpose and the scope of the present invention. Thus, the present invention is not interpreted while limiting to the following description of the embodiments.

Embodiment 1

Embodiment 1 describes a deposition method in which an evaporation donor substrate is used. Note that Embodiment 1 describes the case where an evaporation material is patterned over the evaporation donor substrate and an EL layer of a light-emitting element is formed with use of the patterned evaporation material.

Figure 1A:
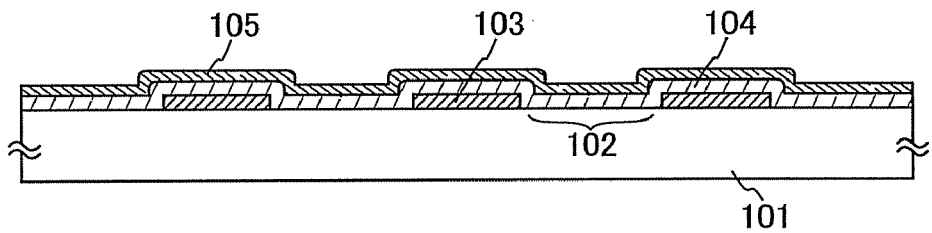
FIGS. 1A to 1D are views illustrating a method for manufacturing an evaporation donor substrate according to one embodiment of the present invention.

The evaporation donor substrate used in this embodiment is described with reference to FIGS. 1A to 1D. As illustrated in FIG. 1A, a reflective layer 103 including an opening portion 102 is formed over a first substrate 101 which is a supporting substrate and a light absorption layer 104 is formed over the first substrate 101 and the reflective layer 103. Note that part of the light absorption layer 104 is formed so as to fill the opening portion 102.

Further, a material layer 105 is formed over the light absorption layer 104. In FIG. 1A, each of the reflective layer 103 including the opening portion 102, the light absorption layer 104, and the material layer 105 is formed over the entire surface of the first substrate 101.

Note that, when the first substrate 101 is irradiated with light, since the first substrate 101 is needed to transmit the light, the first substrate 101 is preferably a substrate having high transmittance. It is also preferable that the first substrate 101 be formed of a material having low thermal conductivity. This is because the first substrate 101 having low thermal conductivity enables heat obtained from the irradiation light to be conducted to the material layer efficiently. As the first substrate 101, for example, a glass substrate, a quartz substrate, a plastic substrate containing an inorganic material, or the like can be used.

Figure 1B:
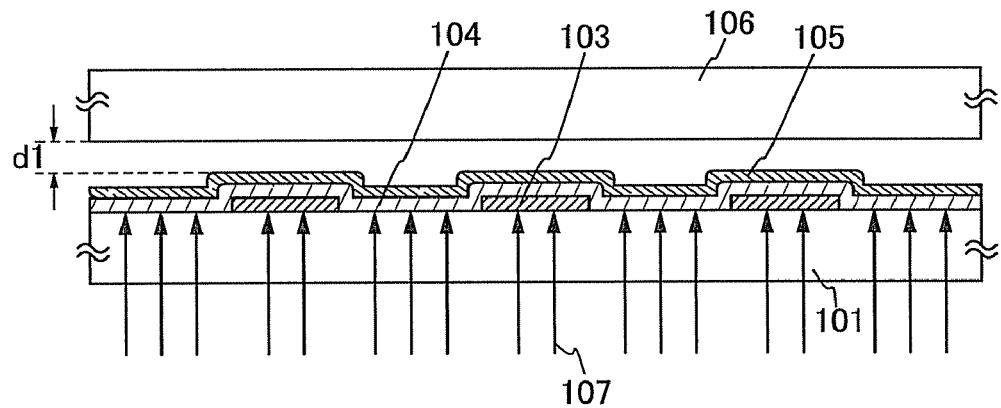
Figure 1C:
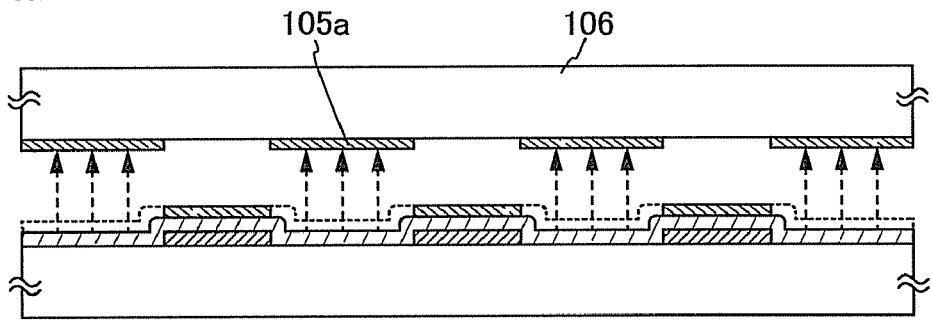

Further, when irradiation with first light 107 illustrated in FIG. 1B is performed, the reflective layer 103 allows part of the light absorption layer 104 to be irradiated with light selectively and reflects the irradiation light in other parts. Therefore, the reflective layer 103 is preferably formed from a material having high reflectance with respect to the first light 107. Specifically, the reflective layer 103 preferably has a reflectance of greater than or equal to 85%, more preferably, a reflectance of greater than or equal to 90% with respect to the irradiation light.

Further, as a material which can be used for the reflective layer 103, for example, aluminum, silver, gold, platinum, copper, an alloy containing aluminum (for example, an aluminum-titanium alloy and an aluminum-neodymium alloy), an alloy containing silver (silver-neodymium alloy), indium oxide-tin oxide, or the like can be used.

Note that the reflective layer 103 can be formed by any of various kinds of methods. For example, a metal film can be formed for use as the reflective layer 103 by a sputtering method, an electron beam evaporation method, a vacuum evaporation method, or the like. It is preferable that the thickness of the reflective layer 103 be greater than or equal to 100 nm although it depends on a material. With a thickness of greater than or equal to 100 nm, transmission of the irradiation light through the reflective layer can be suppressed.

A variety of methods can be used for formation of the opening portion 102 described in this embodiment, and dry etching is preferably used. With use of dry etching, the opening portion 102 has a sharper sidewall. A minute material layer pattern can be formed by using this reflective pattern.

The light absorption layer 104 absorbs light which is used during evaporation. Therefore, it is preferable that the light absorption layer 104 be formed from a material which has low reflectance and high absorptance with respect to the irradiation light. Specifically, it is preferable that the light absorption layer 104 have a reflectance of less than or equal to 70% with respect to the irradiation light.

Further, as a material which can be used for the light absorption layer 104, for example, a metal nitride, such as titanium nitride, tantalum nitride, molybdenum nitride, and tungsten nitride, molybdenum, titanium, tungsten, or the like is preferably used. Note that the light absorption layer 104 is not limited to a single layer and may include a plurality of layers.

Since a kind of a material which is suitable for the light absorption layer 104 varies depending on the wavelength of the irradiation light, the material of the light absorption layer 104 needs to be selected as appropriate.

Further, the light absorption layer 104 can be formed by any of a variety of methods. For example, the light absorption layer 104 can be formed by a sputtering method, an electron beam evaporation method, a vacuum evaporation method, or the like.

It is preferable that the light absorption layer 104 have a thickness with which the irradiation light is not transmitted (the thickness of greater than or equal to 100 nm and less than or equal to 2 μm is preferable) although it depends on a material. In particular, with a thickness of greater than or equal to 100 nm and less than or equal to 600 nm, the light absorption layer 104 can efficiently absorb the irradiation light to generate heat. In addition, the light absorption layer 104 having a thickness of greater than or equal to 100 nm and less than or equal to 600 nm allows highly accurate deposition onto a deposition target substrate.

The light absorption layer 104 may partially transmit the irradiation light as long as the evaporation material contained in the material layer 105 can be heated to the sublimation temperature. Note that when the light absorption layer 104 partially transmits the irradiation light, it is preferable that a material which is not decomposed by light be used as the evaporation material contained in the material layer 105.

In addition, the greater the difference in reflectance between the reflective layer 103 and the light absorption layer 104 is, the more preferable it is. Specifically, the difference in reflectance with respect to the wavelength of the irradiation light is preferably greater than or equal to 25%, more preferably, greater than or equal to 30%.

The material layer 105 includes the evaporation material which is to be evaporated onto the deposition target substrate. Then, by irradiation of the evaporation donor substrate with light, the material layer 105 is heated, so that the evaporation material is sublimated and evaporated onto the deposition target substrate.

Note that any of a variety of materials can be used as the evaporation material contained in the material layer 105 regardless of whether they are organic compounds or inorganic compounds, as long as the material can be evaporated. In the case of forming an EL layer of a light-emitting element as described in this embodiment, a material which can be evaporated to form an EL layer is used. For example, an organic compound, such as a light-emitting material, a carrier-transporting material or a carrier injecting material that forms an EL layer, or an inorganic compound which is used for an electrode of a light-emitting element, such as metal oxide, metal nitride, metal halide, or an elementary substance of metal, as well as a carrier-transporting layer or a carrier-injecting layer included in an EL layer, can be used. Details of the materials which can be evaporated to form an EL layer is given not here but in Embodiment 5; therefore, Embodiment 5 is referred to for details.

The material layer 105 may contain a plurality of materials. The material layer 105 may be a single layer or a stack of a plurality of layers. Accordingly, by stacking a plurality of layers each containing an evaporation material, co-evaporation is possible. In the case where the material layer 105 has a stacked-layer structure, it is preferable that the layers be stacked so that an evaporation material having a low sublimation temperature (or a material which can be evaporated at a lower temperature) be contained in a layer near the first substrate. Such a structure allows efficient evaporation with used of the material layer 105 which has a stacked-layer structure.

The material layer 105 is formed by any of a variety of methods. For example, a wet method, such as a spin coating method, a spray coating method, an ink-jet method, a dip coating method, a casting method, a die coating method, a roll coating method, a blade coating method, a bar coating method, a gravure coating method, or a printing method, can be used. Alternatively, a dry method, such as a vacuum evaporation method or a sputtering method, can be used.

In order to form the material layer 105 by a wet method, a predetermined evaporation material may be dissolved or dispersed into a solvent, and a solution or a dispersion liquid may be adjusted. There is no particular limitation on the solution as long as it can dissolve or disperse an evaporation material and it does not react with the evaporation material. Examples of the solvent are as follows: halogen-based solvents, such as chloroform, tetrachloromethane, dichloromethane, 1,2-dichloroethane, and chlorobenzene; ketone-based solvents such as acetone, methyl ethyl ketone, diethyl ketone, n-propyl methyl ketone, and cyclohexanone; aromatic-based solvents such as benzene, toluene, and xylene; ester-based solvents such as ethyl acetate, n-propyl acetate, n-butyl acetate, ethyl propionate, γ-butyrolactone, and diethyl carbonate; ether-based solvents such as tetrahydrofuran and dioxane; amide-based solvents such as dimethylformamide and dimethylacetamide; dimethyl sulfoxide; hexane; water; and the like. A mixture of plural kinds of these solvents may also be used. By using a wet method, it is possible to increase use efficiency of the material, which leads to a reduction in a manufacturing cost.

Then, as illustrated in FIG. 1B, a second substrate 106 is disposed so as to face a surface of the first substrate 101 over which the reflective layer 103, the light absorption layer 104, and the material layer 105 are formed. Note that the second substrate 106 is a substrate for collecting the material by intentional evaporation of part of the material layer 105 which is sublimated by light irradiation, in the case where the material layer 105 formed over the first substrate 101 is processed to have a desired shape. As illustrated in FIG. 1B, with provision of the second substrate 106, the part of the material layer 105 can be collected, whereby the material collected can be reused when a material layer of another evaporation donor substrate is formed.

Further, it is preferable that the first substrate 101 and the second substrate 106 face each other and that a distance between the first substrate 101 and the second substrate 106 be shortened in order to improve collection efficiency of the material. In particular, a surface of the material layer 105 over the first substrate 101 and a surface of the second substrate 106 are brought close to each other so that a distance $d_1$ between the surface of the material substrate 105 and the surface of the second substrate 106 is set to be less than or equal to 2 mm, preferably less than or equal to 0.05 mm. However, it is preferable that the surface of the material layer 105 and the second substrate 106 be not in contact with each other.

As illustrate in FIG. 1B, when the opposite surface of the first substrate 101 is irradiated with the first light 107, the light with which the reflective layer 103 over the first substrate 101 is irradiated is reflected and the light with which the opening portion 102 is irradiated is absorbed by the light absorption layer 104. Further, the light absorption layer 104 provides heat obtained by the absorbed light to the evaporation material of the material layer 105 so that the evaporation material is sublimated and an evaporation material 105a, which is part of the material layer 105, is evaporated onto the second substrate 106 (see FIG. 1C). Note that the evaporation material 105a evaporated onto the second substrate 106 can be collected to be reused.

Figure 1D:
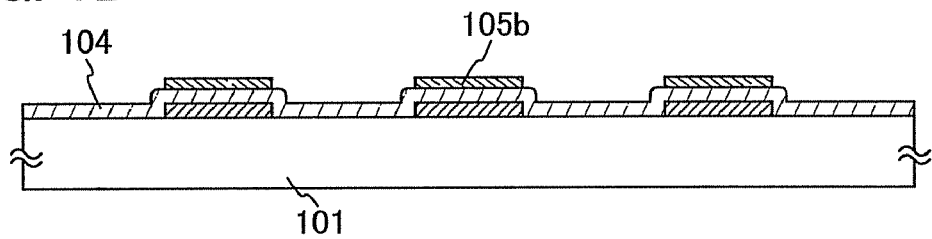

In this manner, the evaporation donor substrate in which a material layer 105b is located so as to overlap with the reflective layer 103 over the first substrate 101 can be formed (see FIG. 1D).

Figure 14:
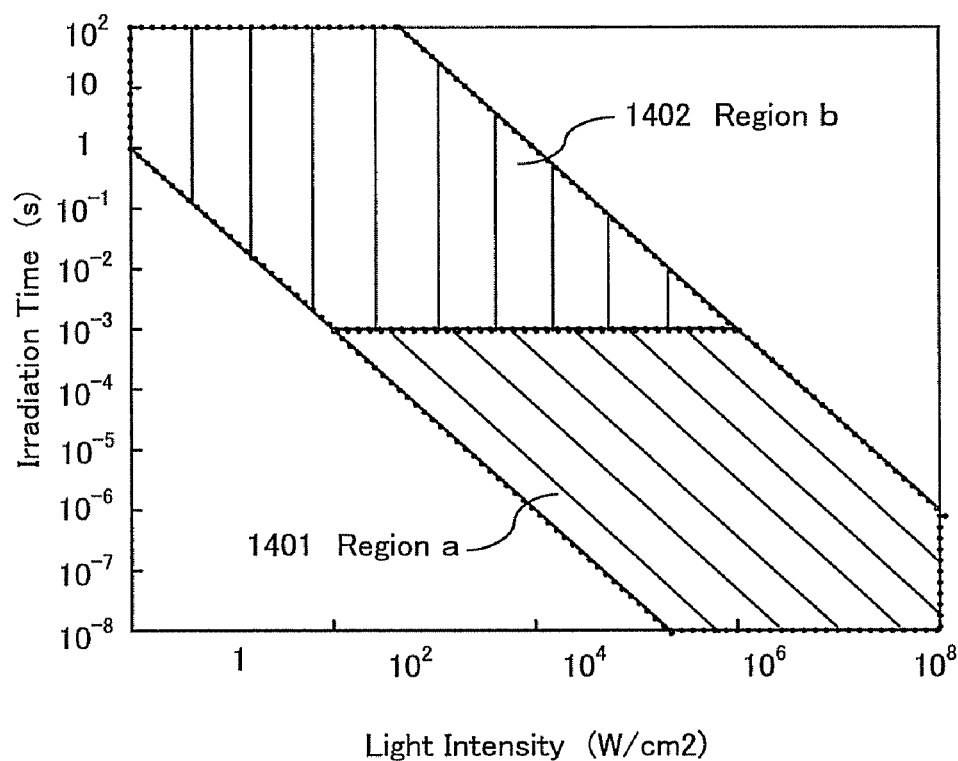
FIG. 14 is a graph showing a region where conditions for first light and second light are satisfied.

The first irradiation light 107 satisfies a general formula (1) described below, where light intensity is $A_1$ (W/cm$^2$) and an irradiation time is $B_1$ (s). Note that the general formula (1) described below is a range shown in a region a (1401) in FIG. 14.

$$1/(A_1)^{1.5} \leq B_1 \leq 10^6/(A_1)^{1.5} \text{ and } B_1 \leq 10^{-3} \quad (1)$$

Note that with the irradiation with the first light in the range of the general formula (1), the material layer 105 in a position which overlaps with the opening portion 102, can be sublimated. Note that with the irradiation with the light in the range of the general formula (1), the light absorption layer 104 is prevented from being damaged due to excess energy. Note that the irradiation tome $B_1$ (s) of the first light 107 is preferably set to be less than or equal to 1 ms, more preferably less than or equal to 0.1 ms in order to prevent the heat generated in the light absorption layer 104 from being conducted in a surface direction.

As the first light 107 used for irradiation, a laser light is preferably used as a light source. As a laser oscillator, a laser oscillator capable of emitting ultraviolet light, visible light, or infrared light can be used. For example, a laser light with a wavelength of 488 nm, 514 nm, 527 nm, 532 nm, or 561 nm can be used. Use of the laser light as a light source allows efficient thermal conversion in the light absorption layer 104 even if the irradiation time is short. Therefore, the precision of the shape of the material layer 105b formed by the partial sublimation of the evaporation material can be improved.

Further, as a laser beam, a laser light emitted from one or more of the following can be used: a gas laser such as an Ar laser, a Kr laser, or an excimer laser; a solid-state laser such as a laser using, as a medium, a single crystalline YAG, YVO$_4$, forsterite (Mg$_2$SiO$_4$), YAlO$_3$, or GdVO$_4$, or a polycrystalline (ceramic) YAG, Y$_2$O$_3$, YVO$_4$, YAlO$_3$, or GdVO$_4$, which is doped with one or more of Nd, Yb, Cr, Ti, Ho, Er, Tm, and Ta, a glass laser, a ruby laser, an alexandrite laser, a Ti:sapphire laser, or a fiber laser. Alternatively, a second harmonic or a third harmonic oscillated from the aforementioned solid-state laser can be used. Note that when a solid-state laser whose laser medium is a solid is used, there are advantages in that maintenance-free conditions can be maintained for a long time, and output is comparatively stable.

Further, a pulsed laser, continuous-wave (CW) laser, or the like can be used for the aforementioned laser. Note that, in the case of a pulsed laser, for example, a laser light with a frequency of not only several Hz to several hundreds kHz but also a frequency greater than or equal to 1 MHz can be used. Further, a laser spot preferably has a linear shape or a rectangular shape. In particular, in the case of a pulsed laser, the length of the major axis of the laser spot can be increased to approximately 1 m, whereby processing time is shortened to improve productivity.

In the present invention, the material layer 105 is heated not with radiation heat from the irradiation light but with heat conducted by the light absorption layer 104 which absorbs the irradiation light. Therefore, it is preferable to set light irradiation time to be short so that heat is not conducted from a part of the light absorption layer 104 which is irradiated with light to a part of the light absorption layer 104 which is not irradiated with light in a surface direction and so that an area of the material layer 105 which is heated is not enlarged.

Further, pattern formation of the material layer 105 by light irradiation is preferably performed under a reduced-pressure atmosphere. Accordingly, it is preferable that a deposition chamber have a pressure of less than or equal to $5\times10^{-3}$ Pa, more preferably greater than or equal to $10^{-6}$ Pa and less than or equal to $10^{-4}$ Pa.

Next, a deposition method in which the first substrate 101 including the material layer 105b illustrated in FIG. 1D is used as an evaporation donor substrate is described with reference to FIGS. 2A to 2C. Note that a method for forming an EL layer of a light-emitting element with use of the evaporation donor substrate is described here.

Figure 2A:
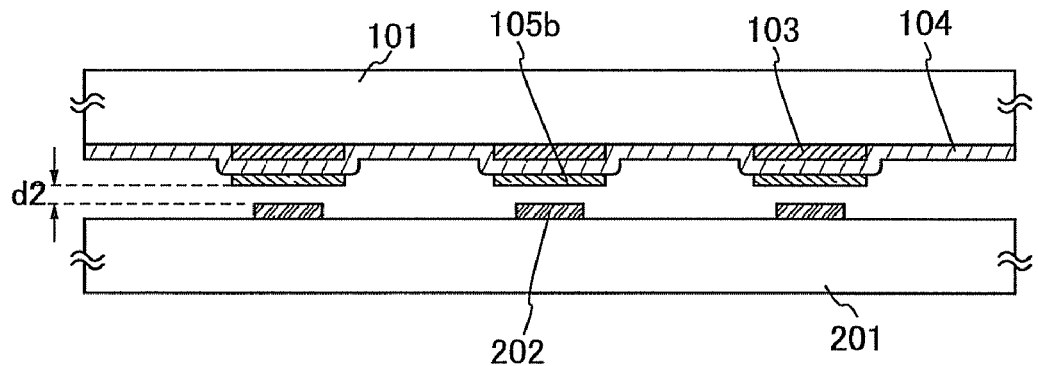
FIGS. 2A to 2C are views illustrating a method for manufacturing an evaporation donor substrate according to one embodiment of the present invention.

In FIG. 2A, the first substrate 101 is disposed so that the surface of the first substrate 101 over which the reflective layer 103, the light absorption layer 104, and the material layer 105b are formed faces a deposition target surface of a third substrate 201 which is a deposition target substrate.

The third substrate 201 is the deposition target substrate over which a desired layer is deposited through an evaporation process using an evaporation donor substrate. Note that since the case where an EL layer of a light-emitting element is formed using an evaporation donor substrate is described here, a first electrode 202 which is one of electrodes of the light-emitting element is formed over the third substrate 201. Then, the first substrate 101 and the third substrate 201 are disposed so as to face each other in proximity; specifically, they are disposed close to each other so that a distance $d_2$ between a surface of the material layer 105b over the first substrate 101 and a surface of the third substrate 201 (in particular, a surface of the first electrode 202) is greater than or equal to 0 mm and less than or equal to 10 μm, preferably greater than or equal to 0 mm and less than or equal to 5 μm, or more preferably greater than or equal to 0 mm and less than or equal to 3 μm.

Figure 3A:
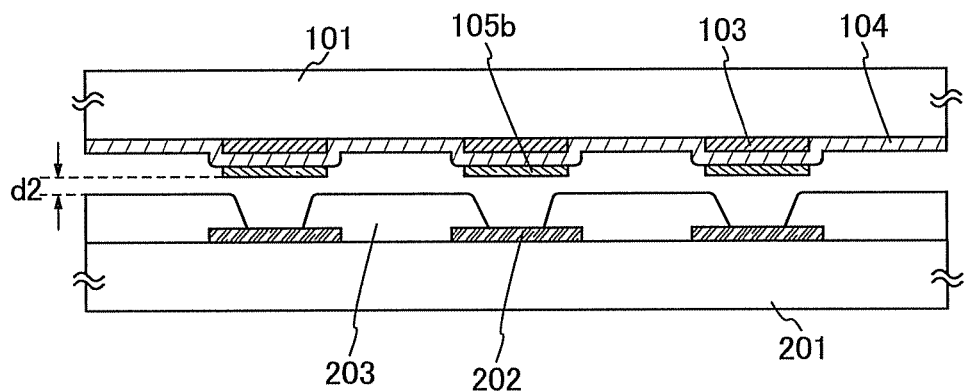
FIGS. 3A to 3C are views illustrating an evaporation donor substrate and a deposition method according to one embodiment of the present invention.

Note that the distance $d_2$ is defined as a distance between the outermost surface of the first substrate 101 and the outermost surface of the third substrate 201. Therefore, when the first electrode 202 is formed over the third substrate 201 and insulator 203 is formed over the third substrate 201 so as to cover and an edge portion of the first electrode 202 as illustrated in FIG. 3A, the distance $d_2$ is defined as a distance between the surface of the material layer 105b over the first substrate 101 and a surface of the insulator 203 formed over the third substrate 201. Note that, when the surface of the material layer 105b over the first substrate 101 and an outermost surface of the layer formed over the third substrate 201 have unevenness, the distance $d_2$ is defined as the shortest distance between the surface of the material layer 105b over the first substrate 101 and the outermost surface of the layer formed over the third substrate 201.

Figure 2B:
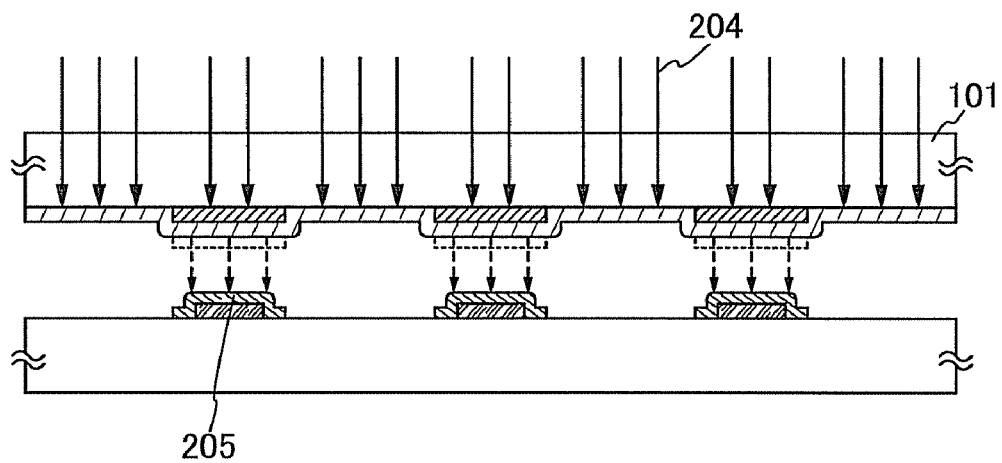
Figure 3B:
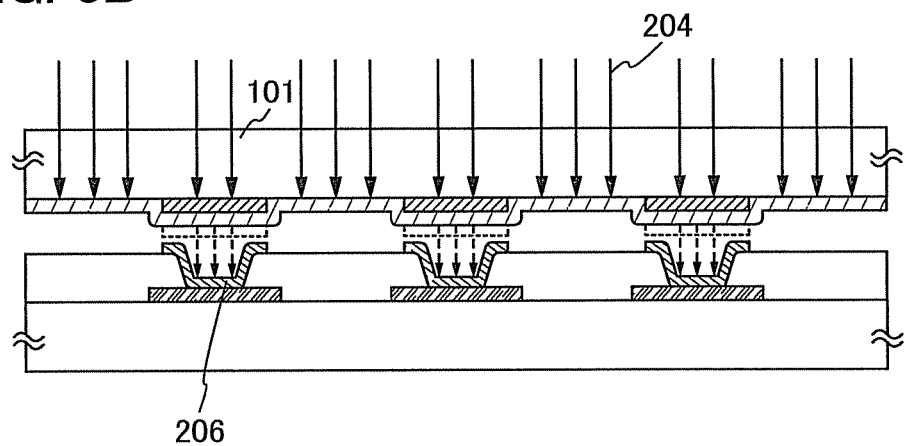

Then, as illustrated in FIG. 2B, a rear surface of the first substrate 101 (the surface over which the reflective layer 103, the light absorption layer 104, and the material layer 105b are not formed) is irradiated with second light 204. With irradiation with the second light 204, heat generated in the light absorption layer 104 is conducted in a surface direction of the light absorption layer 104 and the material layer 105b in a position which overlaps with the reflective layer 103 is heated to evaporate the evaporation material of the material layer 105b onto the first electrode 202 formed over the third substrate 201, whereby an EL layer 205 of a light-emitting element can be formed. Note that the same applies to a structure illustrated in FIGS. 3A to 3C. An EL layer 206 of a light-emitting element is formed over the first electrode 202 of the third substrate 201 as illustrated in FIG. 3B.

The second light 204 used for irradiation satisfies a general formula (2) described below, where light intensity is $A_2$ (W/cm$^2$) and irradiation time is $B_2$ (s). Note that the general formula (2) described below is in a range shown in a region b (1402) in FIG. 14.

$$1/(A_2)^{1.5} \leq B_2 \leq 10^6/(A_2)^{1.5} \text{ and } B_2 > 10^{-3} \qquad (2)$$

Note that, irradiation with the second light in the range of the general formula (2) allows the heat generated in the light absorption layer 104 to be conducted in a surface direction whereby the material layer 105b which in a position which overlaps with the reflective layer 103 can be evaporated onto the third substrate. Note that the irradiation time $B_2$ (s) of the second light 204 is preferably set to be greater than or equal to 1 ms, more preferably greater than or equal to 10 ms.

As for the second light 204, lamp light which enables irradiation on a large area by one-time irradiation is preferably used as a light source. For example, when a halogen lamp is used, the whole first substrate 101 can be heated to a temperature of greater than or equal to 500° C. by irradiation for approximately 7 s, whereby the evaporation material of the material layer 105b can be sublimated.

In the case where a lamp light is used as the light source for the second light 204, a discharge lamp, such as a flash lamp (a xenon flash lamp, a krypton flash lamp, or the like), a xenon lamp, or a metal halide lamp, or an exothermic lamp, such as a halogen lamp or a tungsten lamp, can be used. The flash lamp enables irradiation on a large area for a short time (0.1 millisecond to 10 milliseconds). In addition, the amount of light irradiation of the third substrate 201 can be controlled by changing a time interval of light emission of the flash lamp. In addition, the running cost can be suppressed because of the long lifetime and low power consumption at the time of waiting for light emission of the flash lamp.

It is preferable that evaporation by light irradiation be performed in a reduced-pressure atmosphere. Accordingly, it is preferable that the deposition chamber have a pressure of less than or equal to $5\times10^{-3}$ Pa, more preferably greater than or equal to $10^{-6}$ Pa and less than or equal to $10^{-4}$ Pa.

Note that the case where the light absorption layer 104, which absorbs the light from the light source, provides heat to the material layer 105 is described here; however, this embodiment is not limited thereto and radiation heat due to the irradiation light from a light source may be used. Accordingly, the evaporation material of the material layer 105b may be sublimated not only by light irradiation but also by direct heating with use of a heat source, such as a heater.

Figure 2C:
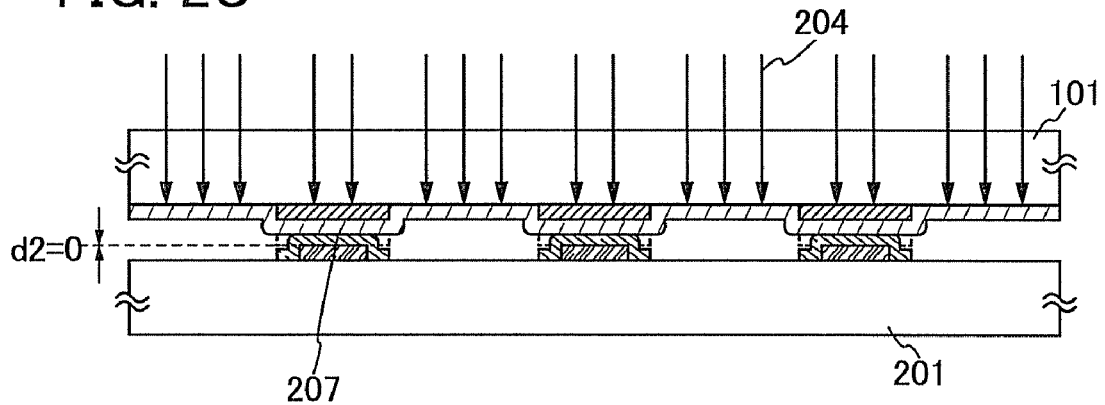
Figure 3C:
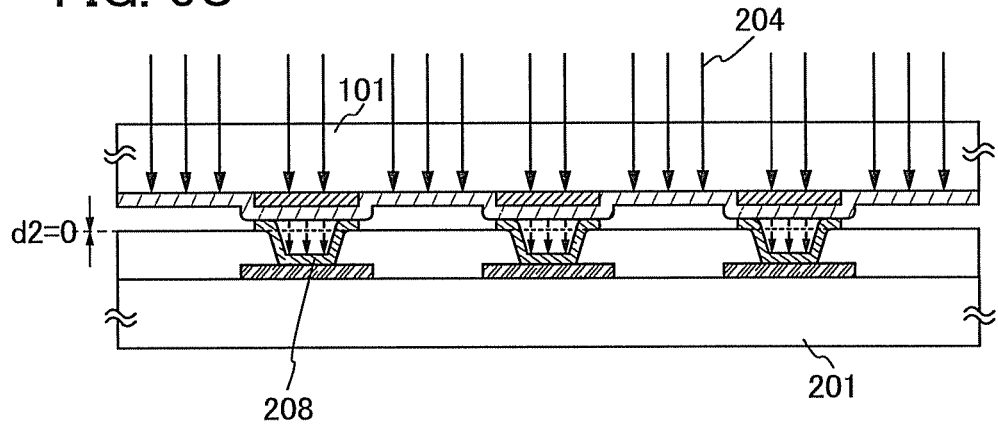

Further, as illustrated in FIG. 2C, the distance $d_2$ between the first substrate 101 and the third substrate 201 may be set to be 0 mm. That is, the material layer 105b over the first substrate 101 and the surface of the first electrode 202 formed over the third substrate 201 are disposed so as to face each other and be in contact with each other. In this manner, reduction of the distance $d_2$ can prevent misplacement of a disposition region, and thus can prevent deformation of a deposited pattern of the disposition target surface. Accordingly, the EL layer 207 of a light-emitting element can be formed over the third substrate 201 with high accuracy. Note that, in the case of FIGS. 3A to 3C, when the distance $d_2$ between the first substrate 101 and the third substrate 201 is set to 0 mm, the surface of the material layer 105b over the first substrate 101 and the surface of the insulator 203 formed over the third substrate 201 are in contact with each other, whereby deformation of the disposition pattern over the deposition target surface due to misplacement of the disposition region can be prevented more effectively. Therefore, an EL layer 208 of the light-emitting element can be formed with high accuracy so as to be in contact with the first electrode 202 over the third substrate 201 as illustrated in FIG. 3C.

Note that, in this embodiment, the case where the third substrate 201 is located below the first substrate 101 is described; however, the present invention is not limited thereto. The orientation of the substrates can be appropriately determined.

In the aforementioned deposition method with use of the evaporation donor substrate, by irradiation with the laser light used as the first light 107 in the pattern formation of the material layer over the evaporation donor substrate, efficient thermal conversion in the light absorption layer is realized with a brief light irradiation. Therefore, the precision of the shape of the material layer 105b formed by the partial sublimation of the evaporation material can be improved.

In addition, when the patterned material layer is evaporated onto the deposition target substrate, by light irradiation using light whose light source is lamp light or the like as the second light 204, a large area can be irradiated at one time. Therefore, the heat conducted in a surface direction in the light absorption layer 104 improves the deposition efficiency in the evaporation of the evaporation material onto the deposition target substrate.

Further, after the evaporation material is irradiated with the first light and sublimated partly so that the material layer over the evaporation donor substrate is processed to have a desired shape, the material layer is evaporated onto the deposition target substrate. Therefore, the precision of the shape of the layer evaporated onto the deposition target substrate can be improved. Further, the evaporation material partly sublimated is evaporated onto another substrate, whereby the evaporation material partly sublimated can be collected and reused and thus a manufacturing cost can be reduced.

Embodiment 2

Embodiment 2 describes an apparatus which is used when an evaporation donor substrate is irradiated with a laser light as a light source of first light, in a deposition method with use of the evaporation donor substrate described in Embodiment 1.

Figure 4:
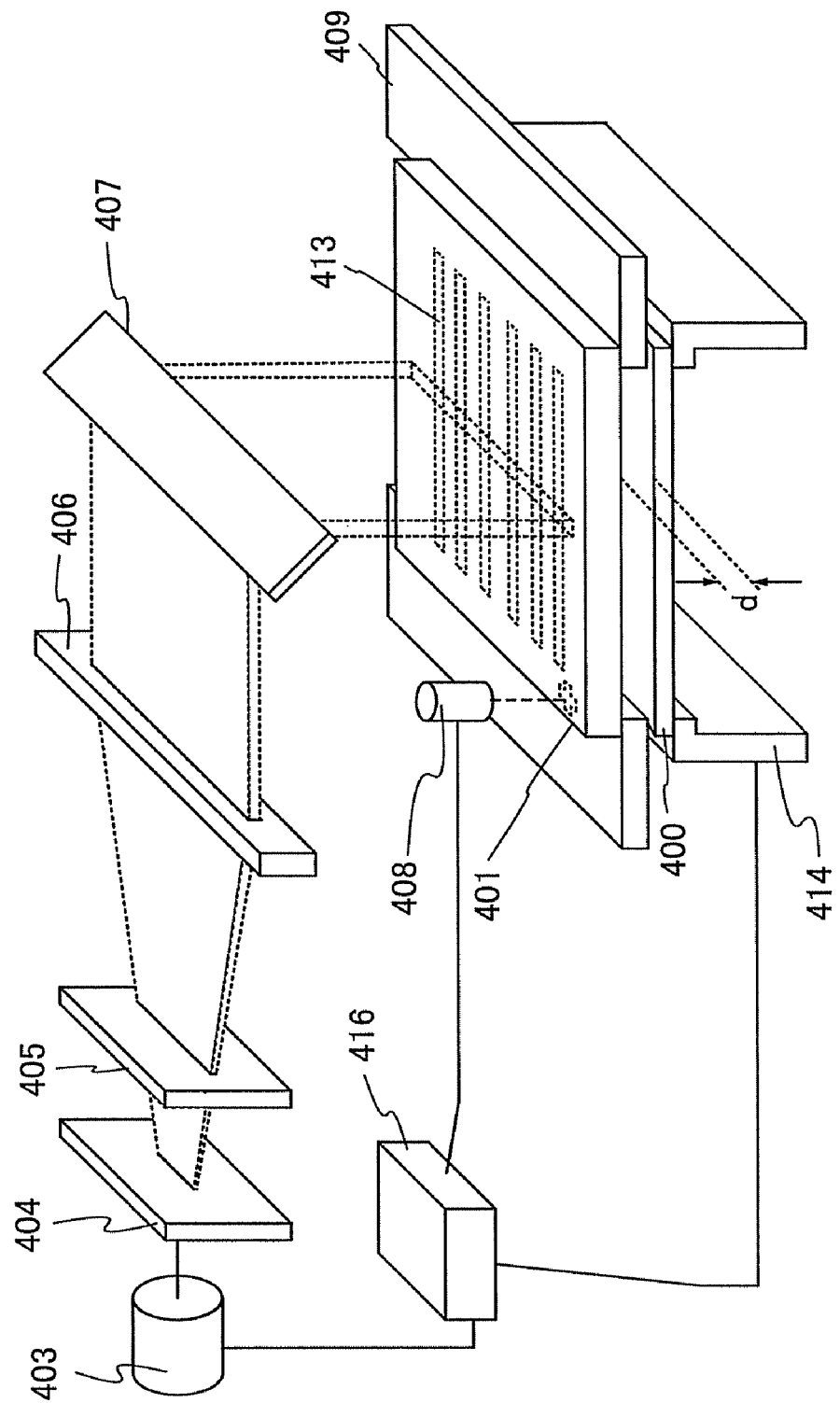
FIG. 4 is a view illustrating an apparatus whose light source is a laser beam.

FIG. 4 is a perspective view illustrating an example of an apparatus using a laser light. The laser light is emitted from a laser oscillator 403 (a YAG laser apparatus, an excimer laser apparatus, or the like) and transmitted through a first optical system 404 for changing a laser light shape into a rectangular shape, a second optical system 405 for shaping the laser beam, and a third optical system 406 for collimating the laser beam. Then, an optical path is bent in a direction perpendicular to a first substrate 401, which is an evaporation donor substrate over a first substrate stage 409, by using a reflecting mirror 407. After that, the first substrate 401 is irradiated with the laser beam.

Note that a structure of the evaporation donor substrate described in Embodiment 2 is similar to that described in Embodiment 1. That is, the first substrate 401 has the structure in which a reflective layer, a light absorption layer, and a material layer are formed. Note that an opening portion of the reflective layer is formed in a region 413 illustrated with a dotted line in FIG. 4.

Further, the shape of a laser spot on the first substrate 401 is preferably set to a rectangular shape or a linear shape. Furthermore, in the case of using a large-sized substrate, a long side of the laser spot is preferably set to be in the range from 20 cm to 100 cm in order to shorten processing time. Further, a plurality of laser oscillators and a plurality of optical systems, each of which is illustrated in FIG. 4, may be provided so that a substrate with a large area is processed in a short time. Specifically, a laser beam may be emitted from each of the plurality of laser oscillators and the area to be processed of the one substrate is shared by the plurality of laser beams.

Note that FIG. 4 illustrates one example, and there is no particular limitation on a positional relationship of each optical system or electrooptical element placed along the optical path of the laser light. For example, the reflective mirror 407 is not used necessarily if the laser oscillator 403 is disposed above the first substrate 401 so that the laser light is emitted from the laser oscillator 403 in a direction perpendicular to a main plane of the first substrate 401. Further, each optical system may employ a condenser lens, a beam expander, a homogenizer, a polarizer, or the like, and these may be combined. Further, as each optical system, slits may be combined.

By two-dimensionally scanning the irradiation region of the laser beam on a surface to be irradiated as appropriate, irradiation is performed on a large area of a substrate. In order to perform scanning, the irradiation region of the laser beam and the substrate are moved relative to each other. Here, a moving means (not illustrated) for moving the first substrate stage 409, which keeps the first substrate 401 that is an evaporation donor substrate, in a direction perpendicular to the long side of the laser spot is controlled by a control device 416 to perform scanning. Note that the control device 416 is preferably interlocked so as to also control the laser oscillator 403. Moreover, the control device 416 is preferably interlocked with a position alignment mechanism 408 which has an image pickup device for recognizing a position marker.

The first substrate 401 and the second substrate 400 are brought closer to each other to face each other so that a distance d between the first substrate 401 and the second substrate 400 is set to be less than or equal to 2 mm, preferably less than or equal to 0.05 mm. Note that a surface of a material layer 412 and a surface of the second substrate 400 are preferably not in contact with each other.

When the material layer 412 is patterned with use of the apparatus illustrated in FIG. 4, at least the first substrate 401 and the second substrate 400 are disposed in a vacuum chamber. All of the components illustrated in FIG. 4 may be placed in the vacuum chamber.

Although FIG. 4 illustrates an example of the apparatus employing a so-called face-up system in which a deposition target surface of the second substrate 400 faces upward, a deposition apparatus employing a face-down system may be used. In addition, an apparatus employing a so-called vertical placement may also be employed in which a main plane of the second substrate 400 is perpendicular to a horizontal plane.

With use of such an apparatus, the material layer of the evaporation donor substrate can be patterned. Further, since the evaporation material evaporated onto the second substrate can be collected to be reused when pattern formation is performed, a manufacturing cost can be reduced.

Note that the structure described in Embodiment 2 can be combined with the structure in Embodiment 1 as appropriate.

Embodiment 3

Embodiment 3 describes an apparatus which is used when an evaporation donor substrate including a patterned material layer is irradiated with a lamp light used as a light source of second light in a deposition method employing the evaporation donor substrate described in Embodiment 1.

Figure 5A:
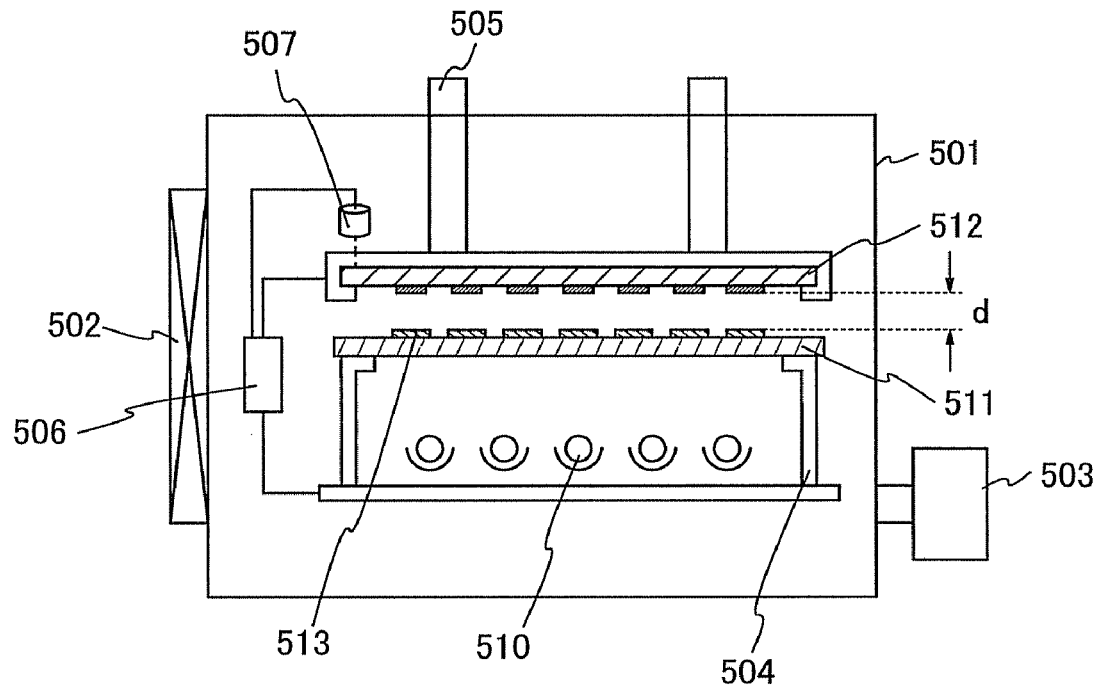
FIGS. 5A and 5B are views illustrating an apparatus whose light source is a lamp light.

In FIG. 5A, a deposition chamber 501, which is a vacuum chamber, is interlocked with another processing chamber by a gate valve 502 and further provided with an exhaust mechanism 503. In addition, the deposition chamber 501 includes at least a substrate stage 504 for keeping a first substrate 511 (including a material layer 513) which is an evaporation donor substrate, a substrate supporting mechanism 505 for keeping a third substrate 512 which is a deposition target substrate, and a light source 510.

Note that a material layer of the first substrate 511 kept on the substrate stage 504 is patterned by performing the treatment described in Embodiment 1 or Embodiment 2 in another processing chamber. That is, after the material layer of the first substrate 511 is patterned in another processing chamber, the resulting substrate is transferred to the deposition chamber 501 and then set on the substrate stage 504. The third substrate 512 is fixed to the substrate supporting mechanism 505 so that a surface of the first substrate 511 over which the material layer 513 is formed faces a deposition target surface of the third substrate 512 which is a deposition target substrate.

Further, by moving the substrate supporting mechanism 505, the first substrate 511 and the third substrate 512 are brought closer to each other so that a distance between the first substrate 511 and the third substrate 512 is the distance d. Note that the distance d is defined as a distance between a surface of the material layer 513 formed over the first substrate 511 and the surface of the third substrate 512. Further, when some kind of layer (for example, a conductive layer which functions as an electrode or an insulator which functions as a partition) is formed over the third substrate 512, the distance d is defined as the distance between the surface of the material layer 513 over the first substrate 511 and the surface of the layer formed over the third substrate 512. Note that, in the case where the surface of the material layer 513 over the first substrate 511, the surface of the third substrate 512, and the surface of the layer formed over the third substrate 512 have unevenness, the distance d is defined as the shortest distance between the surface of the material layer 513 over the first substrate 511 and an outermost surface of the third substrate 512 or an outermost surface of the layer formed over the third substrate 512. Note that the distance d is set to greater than or equal to 0 mm and less than or equal to 10 μm, preferably greater than or equal to 0 mm and less than or equal to 5 μm, and more preferably, greater than or equal to 0 mm and less than or equal to 3 μm.

Figure 5B:
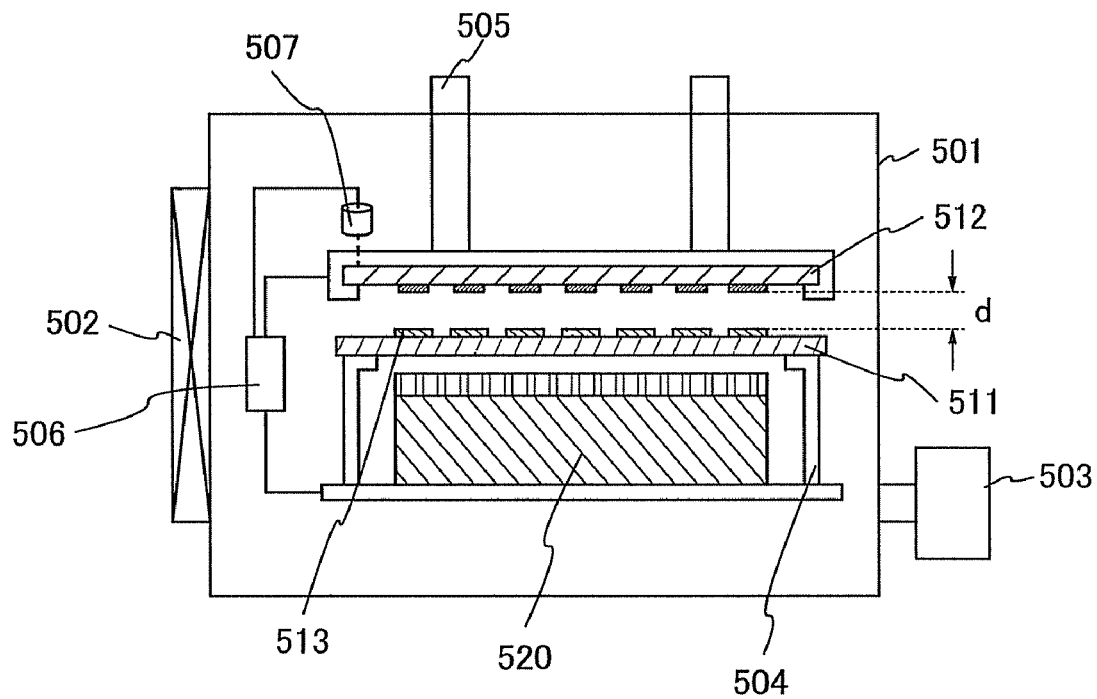

Here, the distance d is set to 2 mm. In addition, if the third substrate 512 is hard like a quartz substrate and formed from a material which is unlikely to be deformed (warped, bent, or the like), the distance d can be reduced to 0 mm as the minimum distance. Further, as for control of the distance between the substrates, although an example in which the substrate stage 504 is fixed and the substrate supporting mechanism 505 is moved is illustrated in FIGS. 5A and 5B, a structure in which the substrate stage 504 is moved and the substrate supporting mechanism 505 is fixed may be employed. Alternatively, both of the substrate stage 504 and the substrate supporting mechanism 505 may be moved. Note that, FIGS. 5A and 5B illustrate a cross section in a step in which the substrate supporting mechanism 505 is moved so that the first substrate 511 and the third substrate 512 are brought closer to each other to have the distance d therebetween.

In FIGS. 5A and 5B, the substrate stage 504 and the substrate supporting mechanism 505 include a moving means (not illustrated) for moving not only in a vertical direction but also in an XY (horizontal) direction and are controlled by the control device 506, whereby alignment is performed with high accuracy. Note that the control device 506 is preferably interlocked with a position alignment mechanism 507 including an image pickup device for recognizing a position marker over the substrate (which is the third substrate 512 in this case). In addition, a sensor for measuring temperature or humidity in the deposition chamber 501 may be provided.

Then, a surface of the first substrate 511 over which the material layer 513 is not formed is irradiated with the second light. Accordingly, the material layer 513 patterned over the first substrate 511 is heated in a short time and the evaporation material contained in the material layer 513 is sublimated, whereby the evaporation material is deposited onto the deposition target surface (that is, a bottom flat surface) of the third substrate 512 which is disposed so as to face the first substrate 511. When the first substrate 511 includes the material layer 513 with a desired uniform thickness in advance, deposition can be performed so that the third substrate 512 has a desired uniform thickness without a film-thickness monitor in the deposition apparatus illustrated in FIGS. 5A and 5B. Although a substrate is rotated in a conventional evaporation apparatus, the deposition target substrate is fixed during deposition in the deposition apparatus illustrated in FIGS. 5A and 5B. Therefore, this deposition apparatus is suitable for deposition onto a large-area glass substrate, which is easily broken. In addition, in the deposition apparatus in FIGS. 5A and 5B, the evaporation donor substrate is also fixed during deposition.

Note that it is preferable that a large area of the light source 510 is opposite the first substrate 511 which is the evaporation donor substrate.

In order to reduce thermal effects on the material layer 513 formed over the first substrate 511 due to heat from the light source on standby, an openable and closable shutter used for thermal insulation on standby (before an evaporation process) may be provided between the light source 510 and the first substrate 511.

As the lamp light used for the light source 510, a discharge lamp, such as a flash lamp (a xenon flash lamp or a krypton flash lamp), a xenon lamp, or a metal halide lamp, or an exothermic lamp such as a halogen lamp or a tungsten lamp can be used. A flash lamp is capable of repeatedly emitting very high-intensity light for a short time (0.1 millisecond to 10 milliseconds) over a large area; thus, heating can be performed uniformly and efficiently regardless of the area of the first substrate. In addition, heating of the first substrate 511 can also be controlled by a changing time interval of light emission. In addition, the running cost can be suppressed because of the long lifetime and low power consumption at the time of waiting for light emission of the flash lamp. In addition, immediate heating is facilitated by using the flash lamp to eliminate a vertical mechanism, a shutter, or the like in a case of using the heater. Thus, further reduction in size of the deposition apparatus can be achieved. A heater 520 is provided as illustrated in FIG. 5B.

Note that although FIGS. 5A and 5B illustrate an example in which the light source 510 is placed in the deposition chamber 501, part of an inner wall of the deposition chamber may be made from a light-transmitting member and the light source 510 may be placed outside the deposition chamber. By providing the light source 510 outside the deposition chamber 501, maintenance such as replacement of light bulbs of the light source 510 can be made easier.

Further, a mechanism for controlling the temperature of the third substrate 512 may be provided. In the case where a cooling mechanism is provided as the mechanism for controlling the temperature, for example, a tube through which a heat medium flows is provided in the substrate supporting mechanism 505 and a cooling medium flows as a heat medium through the tube, whereby the substrate supporting mechanism 505 can be a cold plate. Provision of the cooling mechanism in this manner is useful for deposition of different material layers. On the other hand, when the heating mechanism is provided, the substrate supporting mechanism 505 may be provided with a heating means, such as a heater. Provision of the mechanism for controlling the temperature (heating or cooling) of the third substrate 512 as described above can also prevent warp or the like of the substrate.

Note that although FIGS. 5A and 5B illustrate the deposition apparatus employing the face-down system in which the deposition surface of the third substrate 512 faces downward, a deposition apparatus employing a face-up system in which the deposition surface of the third substrate 512 faces upward can also be used. Further, although FIGS. 5A and 5B illustrate the example of the deposition apparatus in which substrates are horizontally placed, a deposition apparatus in which substrates are vertically placed can also be used.

With use of such a deposition apparatus, the material layer over the evaporation donor substrate can be evaporated onto the deposition target substrate. Note that since the material layer over the evaporation donor substrate is patterned in advance, the evaporation material can be evaporated onto the deposition target substrate with high accuracy.

Note that with use of a lamp light as the light source, a large area can be deposited at one time, whereby a take time can be reduced and a manufacturing cost for a light-emitting device can be reduced.

Note that the structure in Embodiment 3 can be combined with the structure in any of Embodiment 1 or Embodiment 2 as appropriate.

Embodiment 4

Embodiment 4 describes a method for manufacturing a light-emitting device which is capable of full-color display by forming an EL layer of a light-emitting element with a plurality of evaporation donor substrates described in Embodiment 1.

While Embodiment 1 describes the case where EL layers formed from the same kind of material are formed over the third substrate, which is a deposition target substrate, through one deposition process, Embodiment 4 describes the case where three kinds of EL layers each emitting different colors are formed in respective positions over the third substrate.

First, three first substrates which are evaporation donor substrates illustrated in FIG. 1D in Embodiment 1 are prepared. Note that material layers containing evaporation materials for forming EL layers of different emission colors are formed in the respective evaporation donor substrates. Specifically, a first evaporation donor substrate (R) having a material layer (R) for forming an EL layer exhibiting red light emission (an EL layer (R)), a first evaporation donor substrate (G) having a material layer (G) for forming an EL layer exhibiting green light emission (an EL layer (G)), and a first evaporation donor substrate (B) having a material layer (B) for forming an EL layer exhibiting blue light emission (an EL layer (B)) are prepared.

Further, the third substrate which is a deposition target substrate illustrated in FIG. 2A in Embodiment 1 is prepared. Note that a plurality of first electrodes 202 is formed over the third substrate.

First, in a similar manner to FIG. 2A, the third substrate and the first substrate (R) are superimposed on each other and aligned with each other for a first deposition process. It is preferable that the third substrate be provided with an alignment marker. The first substrate (R) is also preferably provided with an alignment marker. Note that since the first substrate (R) is provided with a light absorption layer, a portion of the light absorption layer over and near the alignment marker is preferably removed in advance. Further, the material layer (R) formed over the first substrate (R) is patterned so as to be disposed only in the position where the material layer (R) overlaps with a reflective layer (R) 601.

Then, a rear surface of the first substrate (R) (the surface over which a reflective layer 103, a light absorption layer 104, and a material layer 105b, which are illustrated in FIG. 2A, are not formed) is irradiated with light. The light absorption layer 104 absorbs the irradiation light and conducts heat in a surface direction to the material layer (R) to sublime an evaporation material contained in the material layer (R). Thus, the EL layer (R) is formed over the first electrode over the third substrate 201. After the first deposition is completed, the first substrate (R) is moved away from the third substrate 201.

Next, the third substrate 201 and the first substrate (G) are superimposed on each other and aligned with each other for a second deposition process. Note that the material layer (G) formed over the first substrate (G) is formed in a position which is shifted by one pixel from the material layer (R) formed over the first substrate (R) which has been used in a first deposition process.

Then, the rear surface of the first substrate (G) (the surface illustrated in FIG. 2A, over which the reflective layer 103, the light absorption layer 104, and the material layer 105b are not formed) is irradiated with light. The light absorption layer 104 absorbs light and conducts heat in the plane direction to the material layer (G) to sublime the evaporation material contained in the material layer (G). Thus, the EL layer (G) is formed over the first electrode that is next to the first electrode over the third substrate 201, over which the EL layer (R) is formed in the first deposition. After the second deposition is completed, the first substrate (G) is moved away from the third substrate 201.

Next, the third substrate 201 and the first substrate (B) are superimposed on each other and aligned with each other for a third deposition process. Note that the material layer (B) formed over the first substrate (B) is formed in a position which is shifted by two pixels from the material layer (R) formed over the first substrate (R) which has been used in the first deposition process.

Figure 6A:
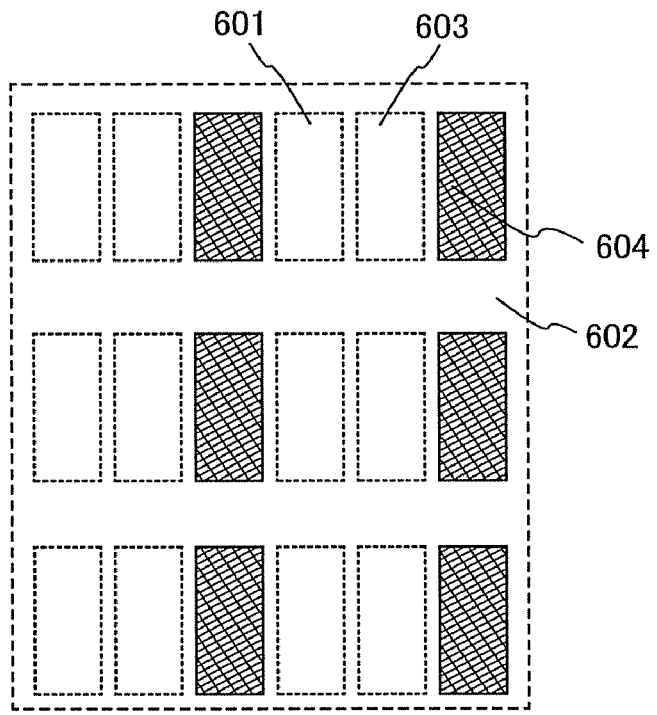
FIGS. 6A and 6B are views illustrating an evaporation donor substrate for full-color display and a pixel arrangement in an EL layer.

Then, a rear surface of the first substrate (B) (the surface illustrated in FIG. 2A, over which the reflective layer 103, the light absorption layer 104, and the material layer 105b are not formed) is irradiated with light. FIG. 6A is a top view illustrating the state immediately before the third deposition is performed. In FIG. 6A, the material layer (B) is formed so as to overlap with the reflective layer (B) 604; the light absorption layer 104 absorbs light which is transmitted through an opening portion 602 of the first substrate (B) and conducts heat in the plane direction to the material layer (B) to sublimate the evaporation material contained in the material layer (B); and an EL layer (B) is formed over the first electrode that is next to the first electrode over the third substrate 201, over which the EL layer (G) is formed in the second deposition.

After the third deposition, the first substrate (B) is moved away from the third substrate 201.

In this manner, the EL layer (R) 611, the EL layer (G) 612, and the EL layer (B) 613 can be formed over the third substrate with regular intervals. Then, a second electrode is formed over these layers. Thus, the light-emitting element can be formed.

Through the above steps, light-emitting elements that exhibit different emission colors are formed over one substrate, whereby a light-emitting device capable of full color display can be formed.

Figure 6B:
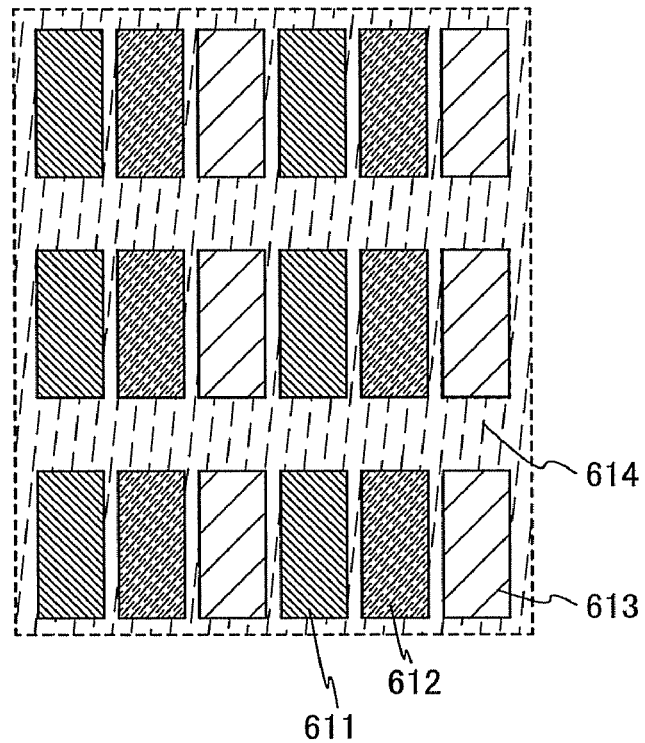

FIGS. 6A and 6B illustrate an example in which each shape of the reflective layer (R) 601, the reflective layer (G) 603, and the reflective layer (B) 604 which are formed over the first substrate which is an evaporation donor substrate is set to be a rectangular shape; however, there in no particular limitation on the shape thereof. When light-emitting regions which have the same emission color are adjacent to each other, the reflective layer (R) 601, the reflective layer (G) 603, and the reflective layer (B) 604 may be formed successively (in so-called a linear shape). Note that when the reflective layer (R) 601, the reflective layer (G) 603, and the reflective layer (B) 604 are formed in a linear shape, since deposition is performed between the light-emitting regions which have the same emission color, an insulator or the like is preferably formed between the first electrodes included in the light-emitting regions. An insulator 614 is formed as illustrated in FIG. 6B.

Figure 7A:
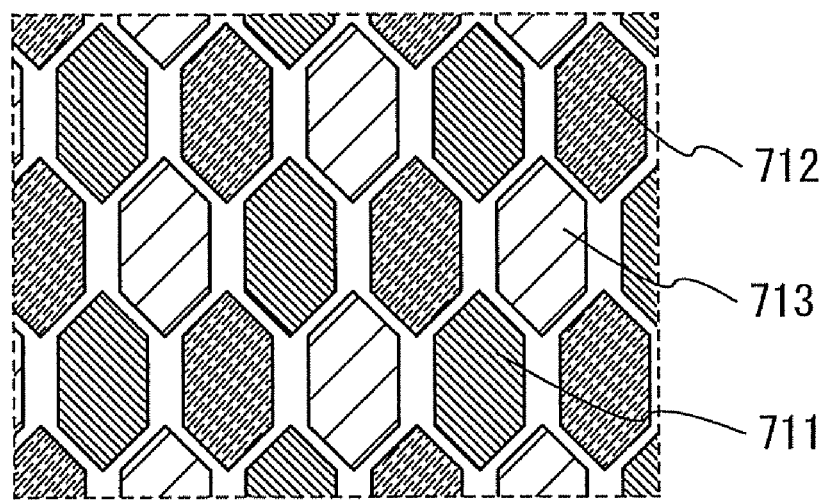
FIGS. 7A and 7B are views illustrating an evaporation donor substrate for full-color display and a pixel arrangement in an EL layer.
Figure 7B:
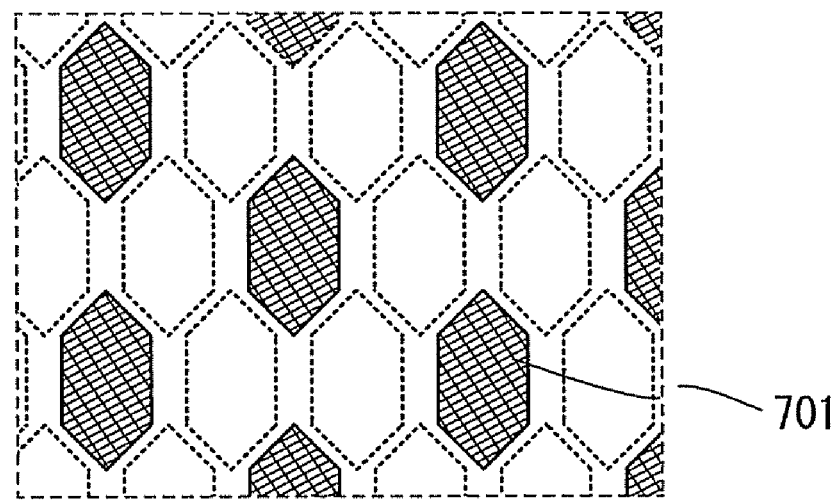

Further, there is no particular limitation on the arrangement of the pixels. The shape of each pixel may be a polygonal shape, for example, a hexagon shape as illustrated in FIG. 7A, and a full-color light-emitting device may be realized by arrangement of an EL layer (R) 711, an EL layer (G) 712, and an EL layer (B) 713. Note that, in order to form the polygonal pixel illustrated in FIG. 7A, deposition may be performed with use of the first substrate including the patterned material layer (R) so as to overlap with the polygonal reflective layer 701 illustrated in FIG. 7B.

Further, in manufacture of the light-emitting device capable of full-color display described in Embodiment 5, the deposition method in which an evaporation donor substrate is used is employed, whereby a minute pattern can be formed with high accuracy. Therefore, not only can the light-emitting element with high definition be obtained but improvement of characteristics thereof can be realized. Further, since the evaporation material which is to be unnecessary in pattern formation of the material layer can be collected to be reused, a manufacturing cost can be reduced.

Note that the structure in Embodiment 4 can be combined with a structure in any of Embodiments 1 to 3 as appropriate.

Embodiment 5

This embodiment describes a manufacturing method of a light-emitting element and a light-emitting device applying one embodiment of the present invention.

Figure 8A:
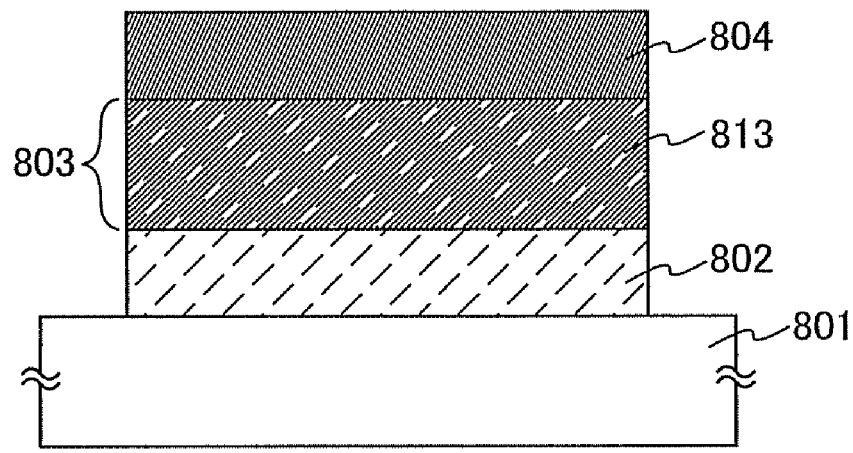
FIGS. 8A and 8B are views illustrating a light-emitting element.
Figure 8B:
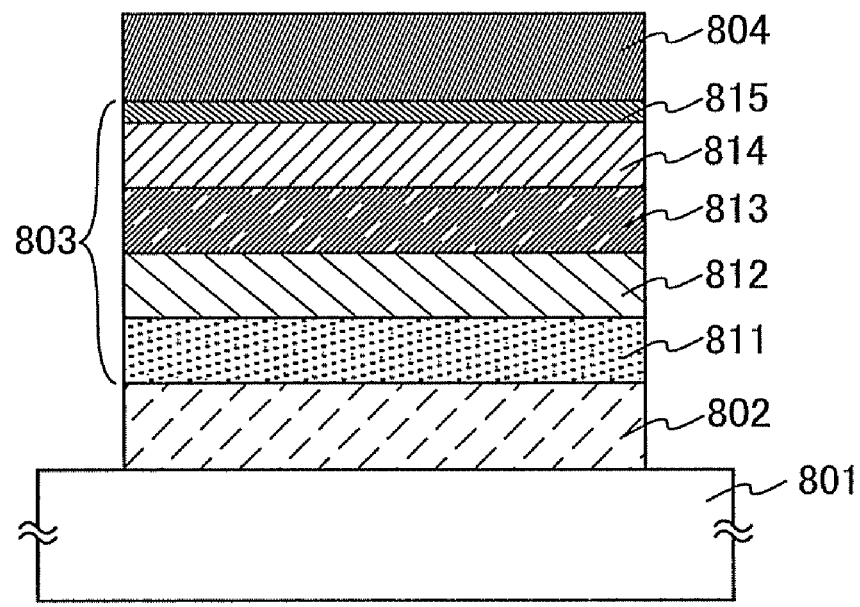

For example, light-emitting elements illustrated in FIGS. 8A and 8B can be manufactured. In the light-emitting element illustrated in FIG. 8A, a first electrode 802, an EL layer 803 which includes only a light-emitting layer 813, and a second electrode 804 are stacked in that order over a substrate 801. One of the first electrode 802 and the second electrode 804 functions as an anode and the other functions as a cathode. Holes injected from an anode and electrons injected from a cathode are recombined in the EL layer 803, whereby light can be emitted. In this embodiment, the first electrode 802 functions as the anode and the second electrode 804 functions as the cathode.

In the light-emitting element illustrated in FIG. 8B, the EL layer 803 in FIG. 8A has a stacked structure including a plurality of layers. Specifically, a hole-injecting layer 811, a hole-transporting layer 812, the light-emitting layer 813, an electron-transporting layer 814, and an electron-injecting layer 815 are provided in that order from the first electrode 802 side. Note that the EL layer 803 functions by including at least the light-emitting layer 813 as in FIG. 8A; therefore, all of the above layers are not always necessary and may be selected as appropriate to be provided as needed.

As the substrate 801 in FIGS. 8A and 8B, a substrate having an insulating surface or an insulating substrate is employed. Specifically, any of a variety of glass substrates made of glass used for the electronics industry, such as alminosilicate glass, aluminoborosilicate glass, or barium borosilicate glass; a quartz substrate; a ceramic substrate; a sapphire substrate; or the like can be used.

For the first electrode 802 and the second electrode 804, any of various types of metals, alloys, electrically conductive compounds, mixtures thereof, and the like can be used. Specifically, indium oxide-tin oxide (ITO), indium oxide-tin oxide containing silicon or silicon oxide, indium oxide-zinc oxide (IZO), tungsten oxide-indium oxide containing tungsten oxide and zinc oxide, or the like is given, for example. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride: TiN), or the like can be given.

These materials are usually formed by a sputtering method. For example, indium zinc oxide can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Alternatively, by application of a sol-gel method or the like, an inkjet method, a spin coating method, or the like may be used for the formation.

Furthermore, aluminum (Al), silver (Ag), an alloy containing aluminum, or the like can be used. Moreover, any of the following materials having a low work function can be used: elements which belong to Group 1 and Group 2 of the periodic table, that is, alkali metals such as lithium (Li) and cesium (Cs) and alkaline-earth metals such as magnesium (Mg), calcium (Ca), and strontium (Sr), and alloys thereof (an alloy of aluminum, magnesium, and silver, and an alloy of aluminum and lithium); rare earth metals such as europium (Eu) and ytterbium (Yb), and alloys thereof; and the like.

A film of an alkali metal, an alkaline earth metal, or an alloy including these can be formed by vacuum evaporation. In addition, an alloy including an alkali metal or an alkaline earth metal can be formed by a sputtering method. Further, silver paste or the like can be formed by an inkjet method. The first electrode 802 and the second electrode 804 can be formed as a stacked-layer film without being limited to a single-layer film.

Note that in order to extract light emitted from the EL layer 803 to the outside, one or both of the first electrode 802 and the second electrode 804 are formed so as to transmit light. For example, one or both of the first electrode 802 and the second electrode 804 are formed using a conductive material having a light-transmitting property, such as indium tin oxide, or formed using silver, aluminum, or the like so as to have a thickness of several nm to several tens nm. Alternatively, the first electrode layer 802 or the second electrode 804 can have a stacked-layer structure including a thin film of a metal such as silver or aluminum and a thin film of a conductive material having a light-transmitting property, such as ITO.

The EL layer 803 (the hole-injecting layer 811, the hole-transporting layer 812, the light-emitting layer 813, the electron-transporting layer 814, or the electron-injecting layer 815) of the light-emitting element described in this embodiment can be formed by application of any of the deposition methods described in Embodiments 1 to 4.

For example, in the case where the light-emitting element illustrated in FIG. 8A is formed, a material layer of the evaporation donor substrate described in Embodiment 1 is formed from a material which is used for the EL layer 803 and the EL layer 803 is formed over the first electrode 802 over the substrate 801 using the evaporation donor substrate. Then, the second electrode 804 is formed over the EL layer 803, whereby the light-emitting element illustrated in FIG. 8A can be obtained.

Various kinds of materials can be used for the light-emitting layer 813. For example, a fluorescent compound which exhibits fluorescence or a phosphorescent compound which exhibits phosphorescence can be used.

Examples of a phosphorescent compound which can be used for the light-emitting layer 813 are given below. For example, as a blue light-emitting material, the following can be given: bis[2-(4',6'-difluorophenyl)pyridinato-N,$C^{2'}$]iridium(III) tetrakis(1-pyrazolyl)borate (abbr.: FIr6); bis[2-(4',6'-difluorophenyl)pyridinato-N,$C^{2'}$]iridium(III) picolinate (abbr.: FIrpic); bis[2-(3',5'bistrifluoromethylphenyl)pyridinato-N,$C^{2'}$]iridium(III) picolinate (abbr.: Ir(CF$_3$ppy)$_2$(pic)); bis[2-(4',6'-difluorophenyl)pyridinato-N,$C^{2'}$]iridium(III) acetylacetonate (abbr.: FIr(acac)); and the like. Further, As a green light-emitting material, the following can be given: tris(2-phenylpyridinato-N,$C^{2'}$)iridium(III) (abbr.: Ir(ppy)$_3$); bis(2-phenylpyridinato-N,$C^{2'}$)iridium(III)(acetylacetonate) (abbr.: Ir(ppy)$_2$(acac)); bis(1,2-diphenyl-1H-benzimidazolato)iridium(III)acetylacetonate (abbr.: Ir(pbi)$_2$(acac)); bis(benzo[h]quinolinato)iridium(III)acetylacetonate (abbr.: Ir(bzq)$_2$(acac)); and the like. Further, as a yellow light-emitting material, the following can be given: bis(2,4-diphenyl-1,3-oxazolato-N,$C^{2'}$)iridium(III)acetylacetonate (abbr.: Ir(dpo)$_2$(acac)); bis[2-(4'-perfluorophenylphenyl)pyridinato]iridium(III)acetylacetonate (abbr.: Ir(p-PF-ph)$_2$(acac)); bis(2-phenylbenzothiazolato-N,$C^{2'}$)iridium(III)acetylacetonate (abbr.: Ir(bt)$_2$(acac)); and the like. As an orange light-emitting material, the following can be given: tris(2-phenylquinolinato-N,$C^{2'}$)iridium(III) (abbr.: Ir(pq)$_3$); bis(2-phenylquinolinato-N,$C^{2'}$)iridium(III)acetylacetonate (abbr.: Ir(pq)$_2$(acac)); and the like. As a red light-emitting material, an organometallic complex, such as bis[2-(2'-benzo[4,5-α]thienyl)pyridinato-N,$C^{3'}$]iridium(acetylacetonate) (abbr.: Ir(btp)$_2$(acac)), bis(1-phenylisoquinolinato-N,$C^{2'}$)iridium(III)acetylacetonate (abbr.: Ir(piq)$_2$(acac)), (acetylacetonato)bis[2,3-bis(4-fluorophenyl)quinoxalinato]iridium(III) (abbr.: Ir(Fdpq)$_2$(acac)), or (2,3,7,8,12,13,17,18-octaethyl-21H,23H-porphyrinato)platinum(II) (abbr.: PtOEP), can be given. In addition, a rare earth metal complex, such as tris(acetylacetonato)(monophenanthroline)terbium(II) (abbr.: Tb(acac)$_3$(Phen)), tris(1,3-diphenyl-1,3-propanedionato)(monophenanthroline)europium(III) (abbr.: Eu(DBM)$_3$(Phen)), or tris[1-(2-thenoyl)-3,3,3-trifluoroacetonato](monophenanthroline)europium(III) (abbr.: Eu(TTA)$_3$(Phen)), performs light emission (electron transition between different multiplicities) from a rare earth metal ion; therefore, such a rare earth metal complex can be used as a phosphorescent compound.

Examples of a fluorescent compound which is used for the light-emitting layer 813 are given below. For example, as a blue light-emitting material, N,N'-bis[4-(9H-carbazol-9-yl)phenyl]-N,N'-diphenylstilbene-4,4'-diamine (abbr.: YGA2S),4-(9H-carbazol-9-yl)-4'-(10-phenyl-9-anthryl)triphenylamine (abbr.: YGAPA), or the like can be given. As a green light-emitting material, the following can be given: N-(9,10-diphenyl-2-anthryl)-N,9-diphenyl-9H-carbazol-3-amine (abbr.: 2PCAPA); N-[9,10-bis(1,1'-biphenyl-2-yl)-2-anthryl]-N,9-diphenyl-9H-carbazol-3-amine (abbr.: 2PCABPhA); N-(9,10-diphenyl-2-anthryl)-N,N',N'-triphenyl-1,4-phenylenediamine (abbr.: 2DPAPA); N-[9,10-bis(1,1'-biphenyl-2-yl)-2-anthryl]-N,N',N'-triphenyl-1,4-phenylenediamine (abbr.: 2DPABPhA); 9,10-bis(1,1'-biphenyl-2-yl)]-N-[4-(9H-carbazol-9-yl)phenyl]-N-phenylanthracene-2-amine (abbr.: 2YGABPhA); N,N,9-triphenylanthracen-9-amine (abbr.: DPhAPhA); and the like. As a yellow light-emitting material, the following can be given: rubrene; 5,12-bis(1,1'-biphenyl-4-yl)-6,11-diphenyltetracene (abbr.: BPT); and the like. Further, as a red light-emitting material, the following can be given: N,N,N',N'-tetrakis(4-methylphenyl)tetracene-5,11-diamine (abbr.: p-mPhTD); 7,13-diphenyl-N,N,N',N'-tetrakis(4-methylphenyl)acenaphtho[1,2-a]fluoranthene-3,10-diamine (abbr.: p-mPhAFD); and the like.

Alternatively, the light-emitting layer 813 can have a structure in which a substance having a high light-emitting property (a dopant material) is dispersed into another substance (a host material). The structure in which a substance with a high light-emitting property (a dopant material) is dispersed into another substance (a host material) is used for the light-emitting layer, whereby crystallization of the light-emitting layer can be controlled. Further, concentration quenching due to high concentration of the substance having a high light-emitting property can be suppressed.

As the substance in which the substance having a high light-emitting property is dispersed, when the substance having a high light emitting property is a fluorescent compound, a substance having singlet excitation energy (the energy difference between a ground state and a singlet excited state) higher than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

As a host material used for the light-emitting layer 813, the following can be given: 4,4'-bis[N-(1-naphthyl)-N-phenylamino]biphenyl (abbr.: NPB); tris(8-quinolinolato)aluminum(III) (abbr.: Alq); 4,4'-bis[N-(9,9-dimethylfluoren-2-yl)-N-phenylamino]biphenyl (abbr.: DFLDPBi); bis(2-methyl-8-quinolinolato)(4-phenylphenolato)aluminum(III) (abbr.: BAlq); 4,4'-di(9-carbazolyl)biphenyl (abbr.: CBP); 2-tert-butyl-9,10-di(2-naphthyl)anthracene (abbr.: t-BuDNA); 9-[4-(9-carbazolyl)phenyl]-10-phenylanthracene (abbr.: CzPA); and the like.

As the dopant material, any of the aforementioned phosphorescent compounds and fluorescent compounds can be used.

When the light-emitting layer 813 has a structure in which a substance having a high light-emitting property (dopant material) is dispersed into another substance (host material), a mixed layer of the host material and the guest material is formed as the material layer over the evaporation donor substrate. Alternatively, the material layer over the evaporation donor substrate may have a structure in which a layer containing a host material and a layer containing a dopant material are stacked. By forming the light-emitting layer 813 using an evaporation donor substrate with the material layer having such a structure, the light-emitting layer 813 contains a substance in which a light-emitting material is dispersed (a host material) and a substance having a high light-emitting property (a dopant material), and has a structure in which the substance having a high light-emitting property (a dopant material) is dispersed into the substance in which a light-emitting material is dispersed (a host material). Note that for the light-emitting layer 813, two or more kinds of host materials and a dopant material may be used, or two or more kinds of dopant materials and a host material may be used. Alternatively, two or more kinds of host materials and two or more kinds of dopant materials may be used.

When the light-emitting element illustrated in FIG. 8B is formed, the evaporation donor substrates described in Embodiment 1 which have material layers formed from respective materials for forming respective layers in the EL layer 803 (the hole-injecting layer 811, the hole-transporting layer 812, the electron-transporting layer 814, and the electron-injecting layer 815) is prepared, and the respective layers are deposited using their respective evaporation donor substrates by the method described in Embodiment 1, whereby the EL layer 803 is formed over the first electrode 802 over the substrate 801. Then, the second electrode 804 is formed over the EL layer 803, and thus the light-emitting element in FIG. 8B can be obtained. Note that although all the layers in the EL layer 803 can be formed by the method described in Embodiment 1 in this case, only some of the layers in the EL layer 803 may be formed by the method described in Embodiment 1.

For example, the hole-injecting layer 811 can be formed using molybdenum oxide, vanadium oxide, ruthenium oxide, tungsten oxide, manganese oxide, or the like. In addition, it is possible to use a phthalocyanine-based compound such as phthalocyanine ($H_2Pc$) or copper phthalocyanine (CuPc), a high molecule such as poly(3,4-ethylenedioxythiophene)/poly(styrenesulfonate) (PEDOT/PSS), or the like to form the hole-injecting layer.

As the hole-injecting layer 811, a layer which contains a substance having a high hole-transporting property and a substance having an electron-accepting property can be used. The layer containing a substance having a high hole-transporting property and a substance having an electron-accepting property has a high carrier density and an excellent hole-injecting property. In addition, the layer containing a substance having a high hole-transporting property and a substance having an electron-accepting property is used as a hole-injecting layer which is in contact with an electrode which functions as an anode, whereby various kinds of metal, alloys, electrically conductive compounds, mixtures thereof, or the like can be used for the electrode regardless of the work function of a material of the electrode which functions as an anode.

The layer which contains a substance having a high hole-transporting property and a substance having an electron-accepting property can be formed using, for example, an evaporation donor substrate having a material layer which is a stack of a layer containing a substance having a high hole-transporting property and a layer containing a substance having an electron-accepting property.

Examples of the substance having an electron-accepting property, which is used for the hole-injecting layer 811, include: 7,7,8,8-tetracyano-2,3,5,6-tetrafluoroquinodimethane (abbr.: F4-TCNQ); chloranil; and the like. In addition, a transition metal oxide is given. Still other examples are oxide of metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of a high electron-accepting property. Among these, molybdenum oxide is especially preferable since it is stable in the air and its hygroscopic property is low so that it can be easily treated.

As the substance having a high hole-transporting property used for the hole-injecting layer 811, any of a variety of compounds such as aromatic amine compounds, carbazole derivatives, aromatic hydrocarbons, and high molecular compounds (such as oligomers, dendrimers, and polymers) can be used. Note that the substance having a high hole-transporting property, which is used for the hole-injecting layer, is preferably a substance having a hole mobility of $10^{-6}$ $cm^2$/Vs or more. Further, another substance may also be used as long as a hole-transporting property thereof is higher than an electron-transporting property. Specific examples of the substance having a high hole-transporting property, which can be used for the hole-injecting layer 811, are given below.

For example, as an aromatic amine compound which can be used for the hole-injecting layer 811, the following can be used: 4,4'-bis[N-(1-naphthyl)-N-phenylamino]biphenyl (abbr.: NPB); N,N'-bis(3-methylphenyl)-N,N'-diphenyl-[1,1'-biphenyl]-4,4'-diamine (abbr.: TPD); 4,4',4"-tris(N,N-diphenylamino)triphenylamine (abbr.: TDATA); 4,4',4"-tris[N-(3-methylphenyl)-N-phenylamino]triphenylamine (abbr.: MTDATA); 4,4'-bis[N-(spiro-9,9'-bifluoren-2-yl)-N-phenylamino]biphenyl (abbr.: BSPB); and the like. Further, the following can be given: N,N'-bis(4-methylphenyl)(p-tolyl)-N,N'-diphenyl-p-phenylenediamine (abbr.: DTDPPA), 4,4'-bis[N-(4-diphenylaminophenyl)-N-phenylamino]biphenyl (abbr.: DPAB), 4,4'-bis(N-{4-[N'-(3-methylphenyl)-N'-phenylamino]phenyl}-N-phenylamino)biphenyl (abbr.: DNTPD); 1,3,5-tris[N-(4-diphenylaminophenyl)-N-phenylamino]benzene (abbr.: DPA3B); and the like.

As the carbazole derivative which can be used for the hole-injecting layer 811, the following can be specifically given: 3-[N-(9-phenylcarbazol-3-yl)-N-phenylamino]-9-phenylcarbazole (abbr.: PCzPCA1); 3,6-bis[N-(9-phenylcarbazol-3-yl)-N-phenylamino]-9-phenylcarbazole (abbr.: PCzPCA2); 3-[N-(1-naphthyl)-N-(9-phenylcarbazol-3-yl)amino]-9-phenylcarbazole (abbr.: PCzPCN1); and the like.

In addition, as the carbazole derivative which can be used for the hole-injecting layer 811, the following can be given: 4,4'-di(N-carbazolyl)biphenyl (abbr.: CBP); 1,3,5-tris[4-(N-carbazolyl)phenyl]benzene (abbr.: TCPB); 9-[4-(10-phenyl-9-anthryl)phenyl]-9H-carbazole (abbr.: CzPA); 1,4-bis[4-(N-carbazolyl)phenyl]-2,3,5,6-tetraphenylbenzene; and the like.

Further, as the aromatic hydrocarbon which can be used for the hole-injecting layer 811, the following can be given: 2-tert-butyl-9,10-di(2-naphthyl)anthracene (abbr.: t-BuDNA), 2-tert-butyl-9,10-di(1-naphthyl)anthracene, 9,10-bis(3,5-diphenylphenyl)anthracene (abbr.: DPPA), 2-tert-butyl-9,10-bis(4-phenylphenyl)anthracene (abbr.: t-BuDBA), 9,10-di(2-naphthyl)anthracene (abbr.: DNA); 9,10-diphenylanthracene (abbr.: DPAnth), 2-tert-butylanthracene (abbr.: t-BuAnth); 9,10-bis(4-methyl-1-naphthyl)anthracene (abbr.: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. In addition, pentacene, coronene, or the like can also be used. As these aromatic hydrocarbons listed here, an aromatic hydrocarbon having a hole mobility of greater than or equal to $1 \times 10^{-6}$ cm$^2$/Vs and having 14 to 42 carbon atoms is preferably used.

Note that an aromatic hydrocarbon which can be used for the hole-injecting layer 811 may have a vinyl skeleton. As examples of the aromatic hydrocarbon having a vinyl group, 4,4'-bis(2,2-diphenylvinyl)biphenyl (abbr.: DPVBi), 9,10-bis [4-(2,2-diphenylvinyl)phenyl]anthracene (abbr.: DPVPA), and the like can be given.

The hole-injecting layer 811 can be formed by using an evaporation donor substrate having a material layer which is a stack of a layer containing a substance having a high hole-transporting property and a layer containing a substance having an electron-accepting property. When a metal oxide is used as the substance having an electron-accepting property, it is preferable that a layer which contains a metal oxide be formed after the layer which contains a substance having a high hole-transporting property be formed over the first substrate 801. This is because, in many cases, metal oxide has a higher decomposition temperature or an evaporation temperature than a substance having a high hole-transporting property. The evaporation source with such a structure makes it possible to efficiently sublimate a substance with a high hole-transporting property and metal oxide. In addition, local non-uniformity of the concentration in a film formed by evaporation can be suppressed. Moreover, there are few kinds of solvents which dissolve or disperse both a substance with a high hole-transporting property and a metal oxide, and a mixed solution is not easily formed. Therefore, it is difficult to directly form a mixed layer by a wet process. However, the use of the deposition method of the present invention makes it possible to easily form a mixed layer which contains a substance having a high hole-transporting property and a metal oxide.

In addition, the layer containing a substance having a high hole-transporting property and a substance having an electron-accepting property is excellent in not only a hole-injecting property but also a hole-transporting property, and thus the aforementioned hole-injecting layer 811 may be used as the hole-transporting layer.

Further, the hole-transporting layer 812 is a layer with a high hole-transporting property. As the substance having a high hole-transporting property, for example, an aromatic amine compound, such as 4,4'-bis[N-(1-naphthyl)-N-phenylamino]biphenyl (abbr.: NPB or α-NPD), N,N'-bis(3-methylphenyl)-N,N'-diphenyl-[1,1'-biphenyl]-4,4'-diamine (abbr.: TPD), 4,4',4''-tris(N,N-diphenylamino)triphenylamine (abbr.: TDATA), 4,4',4''-tris[N-(3-methylphenyl)-N-phenylamino]triphenylamine (abbr.: MTDATA), or 4,4'-bis [N-(spiro-9,9'-bifluoren-2-yl)-N-phenylamino]biphenyl (abbr.: BSPB), or the like can be used. The substances mentioned here mainly have a hole mobility of $10^{-6}$ cm$^2$/Vs or higher. Further, other substances may also be used as long as a hole-transporting property thereof is higher than an electron-transporting property. The layer including a substance having a high hole-transporting property is not limited to a single layer, but two or more layers including the aforementioned substances may be stacked.

The electron-transporting layer 814 contains a substance having a high electron-transporting property. As the substance having a high electron-transporting property, for example, a metal complex having a quinoline skeleton or a benzoquinoline skeleton, such as tris(8-quinolinolato)aluminum (abbr.: Alq); tris(4-methyl-8-quinolinolato)aluminum (abbr.: Almq$_3$); bis(10-hydroxybenzo[h]quinolinato)beryllium (abbr.: BeBq$_2$), or bis(2-methyl-8-quinolinolato)(4-phenylphenolato)aluminum (abbr.: BAlq) can be used. Alternatively, a metal complex or the like having an oxazole-based or thiazole-based ligand, such as bis[2-(2-hydroxyphenyl)benzoxazolato]zinc (abbr.: Zn(BOX)$_2$) or bis[2-(2-hydroxyphenyl)benzothiazolato]zinc (abbr.: Zn(BTZ)$_2$) can be used. Further alternatively, besides the metal complexes, 2-(4-biphenylyl)-5-(4-tert-butylphenyl)-1,3,4-oxadiazole (abbr.: PBD), 1,3-bis[5-p-tert-butylphenyl)-1,3,4-oxadiazol-2-yl] benzene (abbr.: OXD-7), 3-(4-biphenylyl)-4-phenyl-5-(4-tert-butylphenyl)-1,2,4-triazole (abbr.: TAZ01), bathophenanthroline (abbr.: BPhen), bathocuproine (abbr.: BCP), or the like can be used. The substances mentioned here mainly have an electron mobility of $10^{-6}$ cm$^2$/Vs or higher. If a substance has a higher electron transporting property than a hole transporting property, substances other than the above may be used for the electron transporting layer. Further, the electron transporting layer may be a stacked layer of two or more layers formed from the above substances as well as a single layer.

As the electron injecting layer 815, a compound of alkali metal or alkaline earth metal such as lithium fluoride (LiF), cesium fluoride (CsF), or calcium fluoride (CaF$_2$) can be used. Furthermore, a layer, in which a substance having an electron transporting property is combined with an alkali metal or an alkaline earth metal, can be employed. For instance, Alq including magnesium (Mg) can be used. Note that it is preferable that the layer in which a substance having an electron-transporting property is combined with an alkali metal or an alkaline earth metal be used as the electron-injecting layer because electrons are efficiently injected from the second electrode layer 804.

Note that there is no particular limitation on a stack-layer structure of layers of the EL layer 803. The EL layer 803 may be formed by an appropriate combination of a light-emitting layer with any of layers which contain a substance having a high electron-transporting property, a substance having a high hole-transporting property, a substance having a high electron-injecting property, a substance having a high hole-injecting property, a bipolar substance (the substance having a high electron-transporting property and a high hole-transporting property), and the like.

Light emission from the EL layer 803 is extracted to the outside through one or both the first electrode 802 and the second electrode 804. Accordingly, one of or both the first electrode 802 and the second electrode 804 are electrodes having a light-transmitting property. When only the first electrode 802 is a light-transmitting electrode, light is extracted from the substrate 801 side through the first electrode 802. Meanwhile, when only the second electrode 804 is a light-transmitting electrode, light is extracted from a side opposite to the substrate 801 side through the second electrode 804. When both the first electrode 802 and the second electrode 804 are light-transmitting electrodes, light is extracted from both the substrate 801 side and the side opposite to the substrate 801 side through the first electrode 802 and the second electrode 804.

Although FIGS. 8A and 8B illustrate a structure in which the first electrode 802 that functions as an anode is provided on the substrate 801 side, the second electrode 804 that functions as a cathode may be provided on the substrate 801 side.

The EL layer 803 is formed by any one of the deposition methods described in Embodiments 1 to 4 or may be formed by a combination of the deposition methods described in Embodiments 1 to 4. Further, electrodes or layers may be formed by respective formation methods. Examples of a dry method include a vacuum evaporation method, an electron beam evaporation method, a sputtering method, and the like. An ink-jet method, a spin-coating method, or the like can be employed as a wet process.

In the light-emitting element according to Embodiment 5, an EL layer can be formed applying the evaporation donor substrate which is one embodiment of the present invention. Accordingly, a highly accurate film can be formed efficiency. Therefore, not only improvement in characteristics of the light-emitting element, but also improvement in yield and a reduction in cost can be achieved.

Embodiment 6

Embodiment 6 describes a light-emitting device which is formed using the light-emitting element described in Embodiment 5.

First, a passive-matrix light-emitting device is described with reference to FIGS. 9A to 9C and FIG. 10.

In a passive-matrix (also called simple-matrix) light-emitting device, a plurality of anodes arranged in stripes (in strip form) and a plurality of cathodes arranged in stripes are provided to be orthogonal to each other. A light-emitting layer is interposed at each intersection. Therefore, a pixel at an intersection of an anode selected (to which a voltage is applied) and a cathode selected emits light.

FIG. 9A is a top view of a pixel portion before sealing. FIG. 9B is a cross-sectional view taken along a dashed line A-A' in FIG. 9A. FIG. 9C is a cross-sectional view taken along a dashed line B-B' in FIG. 9A.

As a base insulating layer, an insulating layer 904 is formed over a substrate 901. Note that the insulating layer 904 is not necessarily formed if the base insulating layer is not needed. A plurality of first electrode layers 913 is arranged in stripes with regular intervals over the insulating layer 904. Partitions 914 each having an opening portion corresponding to respective pixels are provided over the first electrodes 913. The partitions 914 having an opening portion are formed from an insulating material (a photosensitive or nonphotosensitive organic material such as polyimide, acrylic, polyamide, polyimide amide, resist, or benzocyclobutene, or an SOG film such as a SiOx film containing an alkyl group). Note that each opening portion corresponding to a pixel is a light-emitting region 921.

A plurality of inversely tapered partitions 922 is provided over the partitions 914 each having an opening portion, which are parallel to each other and extend in a direction to intersect the first electrodes 913. The inversely tapered partitions 922 are formed by a photolithography method using a positive photosensitive resin by which an unexposed portion remains as a pattern and controlling the amount of light exposure or developing time in such a manner that a lower portion of the pattern is etched more.

The total thickness of the partition 914 having an opening portion and the inversely tapered partition 922 is set to be larger than the total thickness of an EL layer and a second electrode 916. Thus, an EL layer which is divided into plural regions, specifically, an EL layer (R) (915R) formed from a material which exhibits red light emission, an EL layer (G) (915G) formed from a material which exhibits green light emission, and an EL layer (B) (915B) formed from a material which exhibits blue light emission; and the second electrodes 916 are formed. Note that the plurality of separated regions is electrically isolated from one another.

The second electrodes 916 are electrodes arranged in stripes which are parallel to each other and extend in the direction intersecting with the first electrodes 913. Note that the EL layer and a part of a conductive layer forming the second electrodes 916 are also formed over the inversely tapered partitions 922; however, they are separated from the EL layer (R) (915R), the EL layer (G) (915G), the EL layer (B) (915B), and the second electrodes 916. Note that the EL layer in this embodiment is a layer including at least a light-emitting layer and may include a hole-injecting layer, a hole-transporting layer, an electron-transporting layer, an electron-injecting layer, or the like in addition to the light-emitting layer.

Here, an example is described in which the EL layer (R) (915R), the EL layer (G) (915G), and the EL layer (B) (915B) are selectively formed to form a light-emitting device which provides three kinds of light emission (red (R), green (G), blue (B)) and is capable of performing full-color display. The EL layer (R) (915R), the EL layer (G) (915G), and the EL layer (B) (915B) are formed in stripes to be parallel to each other. These EL layers may be formed by applying any one of the methods described in Embodiments 1 to 4.

Further, sealing is performed using a sealant such as a sealant can or a glass substrate for sealing, if necessary. In this embodiment, a glass substrate is used as a sealing substrate, and a substrate and the sealing substrate are attached to each other with an adhesive material such as an sealing material to seal a space surrounded by the adhesive material such as a sealing material. The space that is sealed is filled with a filler or a dried inert gas. In addition, a desiccant or the like may be put between the substrate and the sealing material so that reliability of the light emitting device is increased. The desiccant agent removes a minute amount of moisture for sufficient desiccation. For the desiccant agent, a substance that adsorbs moisture by chemical adsorption such as oxide of alkaline earth metal such as calcium oxide or barium oxide can be used. In addition, a substance that adsorbs moisture by physical adsorption such as zeolite or silicagel may be used.

The desiccant agent is not necessarily provided if the sealant that covers and is contact with the light-emitting element is provided to sufficiently block the outside air.

Figure 10:
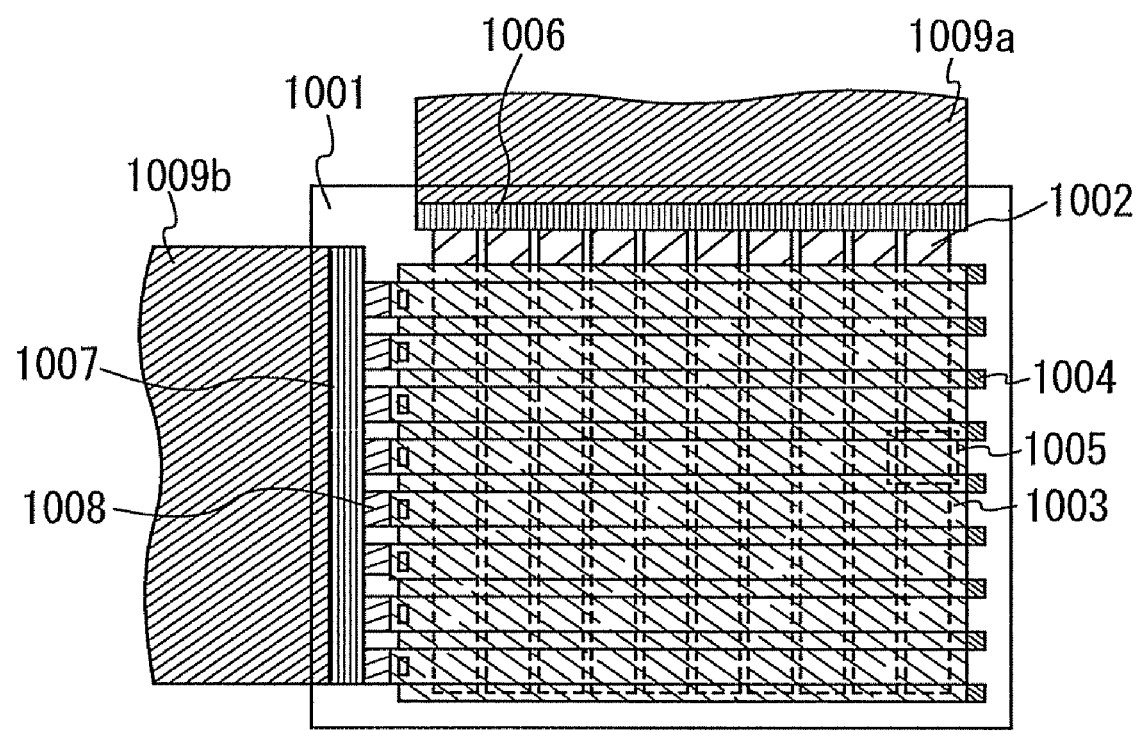
FIG. 10 is a view illustrating a passive-matrix light-emitting device.

Next, FIG. 10 illustrates a top view of the case in which the passive-matrix light-emitting device in FIGS. 9A to 9C is mounted with an FPC or the like.

In FIG. 10, scan lines and data lines intersect so as to be orthogonal to each other in a pixel portion for displaying images.

Here, the first electrodes 913 in FIGS. 9A to 9C correspond to scan lines 1003 in FIG. 10; the second electrodes 916 correspond to data lines 1002; and the inversely tapered partitions 922 correspond to partitions 1004. EL layers are sandwiched between the data lines 1002 and the scan lines 1003, and an intersection portion indicated by a region 1005 corresponds to one pixel.

Note that the scan lines 1003 are electrically connected at their ends to connection wirings 1008, and the connection wirings 1008 are connected to an FPC 1009b through an input terminal 1007. The data lines 1002 are connected to an FPC 1009a through an input terminal 1006.

In addition, an optical film such as a polarizing plate, a circularly polarizing light plate (including an elliptically polarizing plate), a retardation plate (a λ/4 plate or a λ/2 plate), or a color filter may be provided as appropriate on the light-emission surface. Further, the polarizing plate or the circulary polarizing plate may be provided with an anti-reflection film. For example, an anti-glare treatment which can diffuse reflected light in the depression/projection of the surface, and reduce glare can be performed.

Although FIG. 10 illustrates the example in which a driver circuit is not provided over the substrate, the present invention is not particularly limited thereto. An IC chip including a driver circuit may be mounted over the substrate.

In the case where an IC chip is mounted, a data line side IC and a scan line side IC, in each of which a driver circuit for transmitting a signal to the pixel portion is formed, are mounted on the periphery of (outside of) the pixel portion by a COG method. As an alternative mounting technique to the COG bonding, TCP or wire bonding may be used. TCP is a TAB tape on which an IC is mounted, and the IC is mounted by connecting the TAB tape to wires on the element forming substrate. Each of the data line side IC and the scanning line side IC may be formed using a silicon substrate. Alternatively, it may be formed in such a manner that a driver circuit is formed using a TFT over a glass substrate, a quartz substrate, or a plastic substrate. Although described here is an example in which one IC is provided on one side, a plurality of ICs may be provided on one side.

Figure 11A:
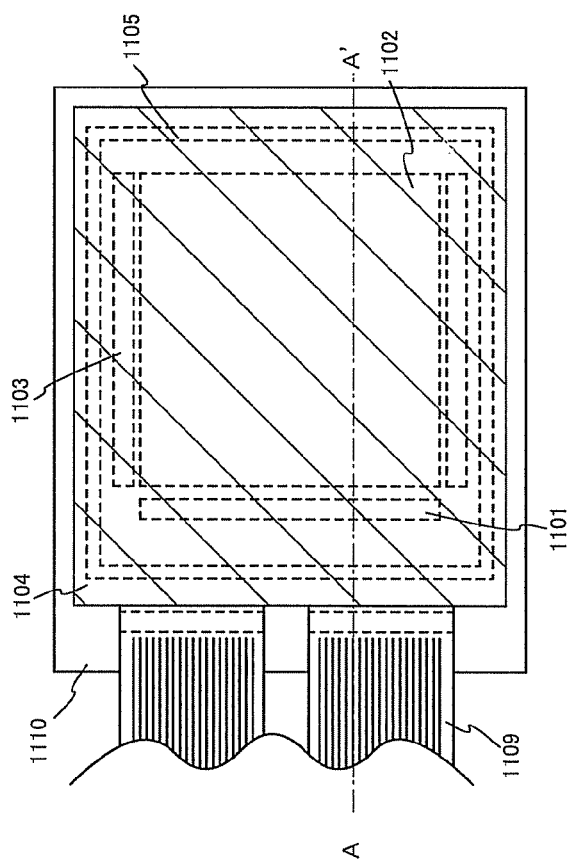
FIGS. 11A and 11B are views illustrating an active-matrix light-emitting device.
Figure 11B:
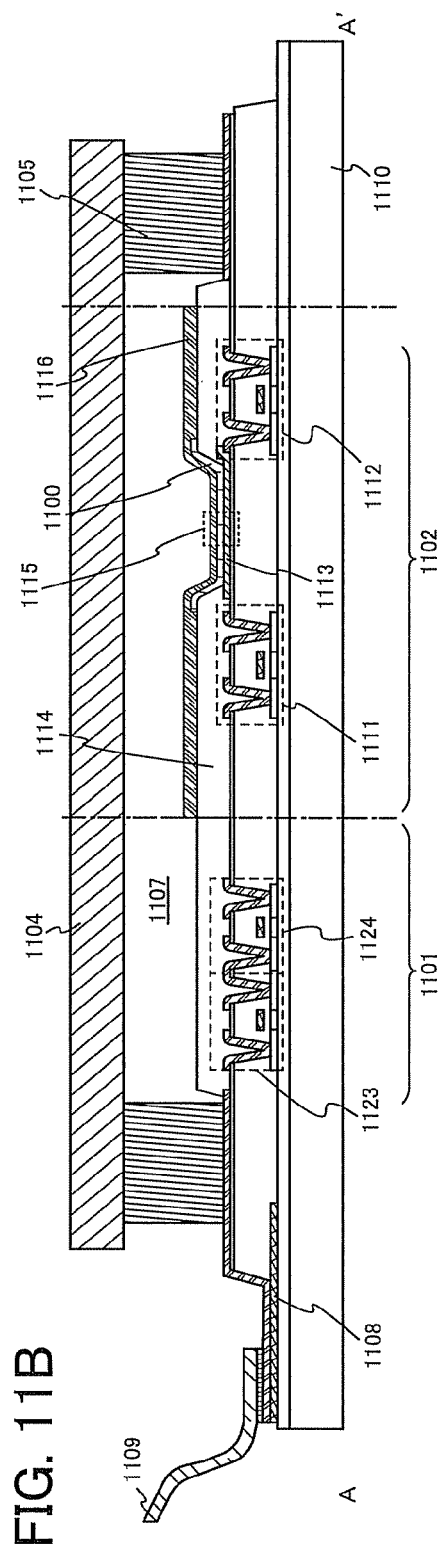

Next, an example of an active-matrix light-emitting device is described with reference to FIGS. 11A and 11B. Note that FIG. 11A is a top view illustrating a light-emitting device and FIG. 11B is a cross sectional view taken along a dashed line A-A' in FIG. 11A. The active-matrix light-emitting device of this embodiment includes a pixel portion 1102 provided over an element substrate 1110, a driver circuit portion (a source-side driver circuit) 1101, and a driver circuit portion (a gate-side driver circuit) 1103. The pixel portion 1102, the driver circuit portion 1101, and the driver circuit portion 1103 are sealed, with a sealant 1105, between the element substrate 1110 and a sealing substrate 1104.

In addition, over the element substrate 1110, a lead wiring 1108 for connecting an external input terminal which transmits a signal (for example, a video signal, a clock signal, a start signal, or a reset signal) or an electric potential to the driver circuit portion 1101 and the driver circuit portion 1103 is provided. Here, an example in which an FPC (flexible printed circuit) 1109 is provided as the external input terminal is described. Although only the FPC is illustrated here, this FPC may be provided with a printed wiring board (PWB). The light-emitting device in this specification includes not only a light-emitting device body but also a state in which an FPC or a PWB is attached thereto.

A sectional structure thereof is described with reference to FIG. 11B. The driver circuit portions and the pixel portion are formed over the element substrate 1110; however, the pixel portion 1102 and the driver circuit portion 1101 which is the source-side driver circuit are illustrated in FIG. 11B.

An example is illustrated in which a CMOS circuit which is the combination of an n-channel TFT 1123 and a p-channel TFT 1124 is formed as the driver circuit portion 1101. Note that a circuit included in the driver circuit portion may be formed of various CMOS circuits, PMOS circuits, or NMOS circuits. Although a driver-integrated type where the driver circuit is formed over the substrate is described in this embodiment, the present invention is not limited to this structure, and the driver circuit may be formed outside the substrate, not over the substrate.

The pixel portion 1102 includes a plurality of pixels, each of which includes a switching TFT 1111, a current-controlling TFT 1112, and a first electrode 1113 which is electrically connected to a wiring (a source electrode or a drain electrode) of the current-controlling TFT 1112. Note that an insulator 1114 is formed to cover end portions of the first electrode 1113. In this embodiment, the insulator 1114 is formed using a positive photosensitive acrylic resin.

Further, the insulator 1114 is preferably formed so as to have a curved surface with curvature at an upper end portion or a lower end portion of the insulator 1114 in order to obtain favorable coverage with a film which is to be stacked over the insulator 1114. For example, in the case of using a positive photosensitive acrylic resin as a material for the insulator 1114, the insulator 1114 is preferably formed so as to have a curved surface with a curvature radius (0.2 μm to 3 μm) at the upper end portion thereof. Note that either a negative photosensitive material which becomes insoluble in an etchant by light irradiation or a positive photosensitive material which becomes soluble in an etchant by light irradiation can be used for the insulator 1114. As the insulator 1114, without limitation to an organic compound, either an organic compound or an inorganic compound, such as silicon oxide or silicon oxynitride, can be used.

An EL layer 1100 and a second electrode 1116 are stacked over the first electrode 1113. Note that when an ITO film is used as the first electrode layer 1113, and a stacked-layer film of a titanium nitride film and a film containing aluminum as its main component or a stacked-layer film of a titanium nitride film, a film containing aluminum as its main component, and a titanium nitride film is used as the wiring of the current-controlling TFT 1112 which is connected to the first electrode layer 1113, resistance of the wiring is low and favorable ohmic contact with the ITO film can be obtained. Note that, although not illustrated in FIGS. 11A and 11B, the second electrode layer 1116 is electrically connected to the FPC 1109 which is an external input terminal.

In the EL layer 1100, at least the light-emitting layer is provided, and in addition to the light-emitting layer, a hole injecting layer, a hole-transporting layer, an electron-transporting layer, and/or an electron-injecting layer are/is provided as appropriate. The first electrode 1113, the EL layer 1100, and the second electrode 1116 are stacked, whereby a light-emitting element 1115 is formed.

Although the cross sectional view in FIG. 11B illustrates only one light-emitting element 1115, the plurality of light-emitting elements are arranged in matrix in the pixel portion 1102. Light-emitting elements which provide three kinds of light emissions (R, G, and B) are selectively formed in the pixel portion 1102, so that a light-emitting device capable of full-color display can be formed. Alternatively, by a combination with color filters, a light emitting device capable of full-color display may be formed.

Furthermore, the sealing substrate 1104 and the element substrate 1110 are bonded to each other with the sealing material 1105, whereby the light-emitting element 1115 is provided in a space 1107 surrounded by the element substrate 1110, the sealing substrate 1104, and the sealing material 1105. Note that the space 1107 may be filled with an inert gas (for example, nitride or argon) or the sealant 1105.

Note that an epoxy-based resin is preferably used for the sealant 1105. In addition, it is preferable to use a material that allows permeation of moisture or oxygen as little as possible. The sealing substrate 1104 may be formed with a plastic substrate formed of FRP (fiberglass-reinforced plastics), PVF (polyvinyl fluoride), mylar, polyester, acrylic, or the like as well as a glass substrate or a quartz substrate.

As described above, a light-emitting device can be obtained according to one embodiment of the present invention. An active-matrix light-emitting device is likely to require a high manufacturing cost per device because TFTs are manufactured; however, application of one embodiment of the present invention makes it possible to drastically reduce loss of materials in forming light-emitting elements. Thus, a reduction in a manufacturing cost can be achieved.

According to one embodiment of the present invention, formation of an EL layer included in a light-emitting element can be facilitated as well as manufacture of a light-emitting device including the light-emitting element. In addition, a precise pattern can be formed, and thus a high-definition light-emitting device can be obtained.

Note that the structure in Embodiment 6 can be combined with the structure in any of Embodiments 1 to 5 as appropriate.

Embodiment 7

In this embodiment, various electronic devices each of which is completed using the light-emitting device manufactured by application of one embodiment of the present invention are described using FIGS. 12A to 12E.

As examples of electronic devices to which the light-emitting device according to one embodiment of the present invention is applied, there are televisions, cameras such as video cameras or digital cameras, goggle type displays (head-mounted displays), navigation systems, audio playback devices (car audio systems, audio systems, or the like), laptop computers, game machines, portable information terminals (mobile computers, cellular phones, smartphones, portable game machines, electronic book readers, or the like), image playback devices in which a recording medium is provided (devices that are capable of playing back recording media such as digital versatile discs (DVDs) and equipped with a display device that can display an image), lighting devices, and the like. Specific examples of these electronic devices are illustrated in FIGS. 12A to 12E.

Figure 12A:
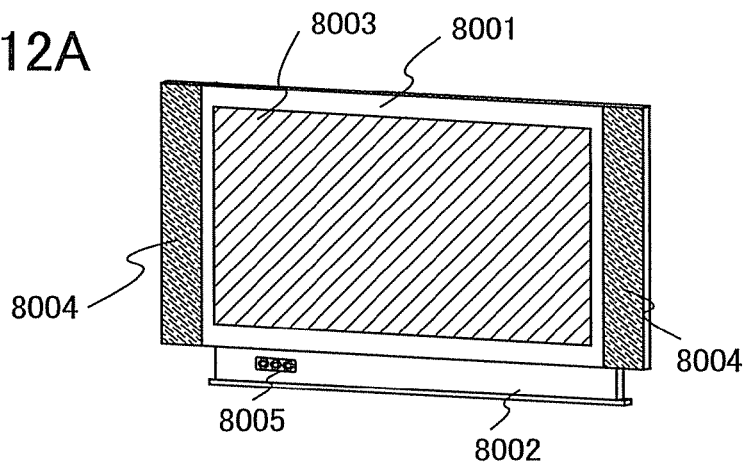
FIGS. 12A to 12E are views each illustrating an electric device.

FIG. 12A illustrates a display device including a chassis 8001, a supporting base 8002, a display portion 8003, a speaker portion 8004, a video input terminal 8005, and the like. The display device is manufactured by using a light-emitting device formed according to one embodiment of the present invention for the display portion 8003. Note that the display device includes all devices for displaying information such as for a personal computer, for receiving TV broadcasting, and for displaying an advertisement. With application of one embodiment of the present invention, deterioration of a material in film formation is prevented and pattern can be formed with high accuracy. Therefore, a light-emitting device with high definition, high light-emitting characteristics and the long lifetime can be provided.

Figure 12B:
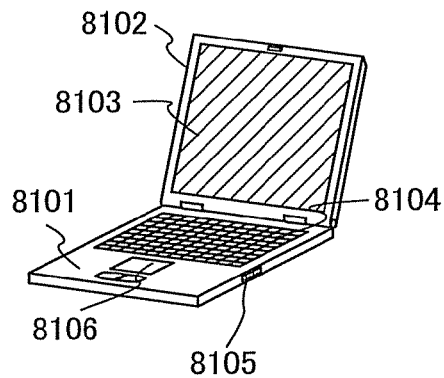

FIG. 12B illustrates a computer, which includes a main body 8101, a housing 8102, a display portion 8103, a keyboard 8104, an external connection port 8105, a pointing device 8106, and the like. This computer is manufactured using a light-emitting device which is formed according to one embodiment of the present invention in the display portion 8103. With application of one embodiment of the present invention, deterioration of a material in film formation is prevented and pattern can be formed with high accuracy. Therefore, a computer with high definition, high light-emitting characteristics, and the long lifetime can be provided.

Figure 12C:
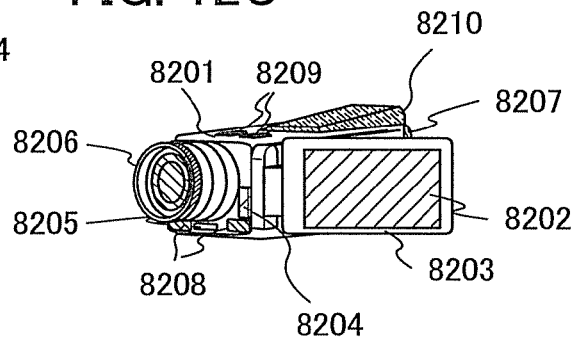

FIG. 12C illustrates a video camera including a main body 8201, a display portion 8202, a housing 8203, an external connection port 8204, a remote control receiving portion 8205, an image receiving portion 8206, a battery 8207, an audio input portion 8208, operation keys 8209, an eyepiece portion 8210, and the like. This video camera is manufactured using a light-emitting device which is formed according to one embodiment of the present invention in the display portion 8202. With application of one embodiment of the present invention, deterioration of a material in film formation is prevented and pattern can be formed with high accuracy. Therefore, a video camera with high definition, high light-emitting characteristics, and the long lifetime can be provided.

Figure 12D:
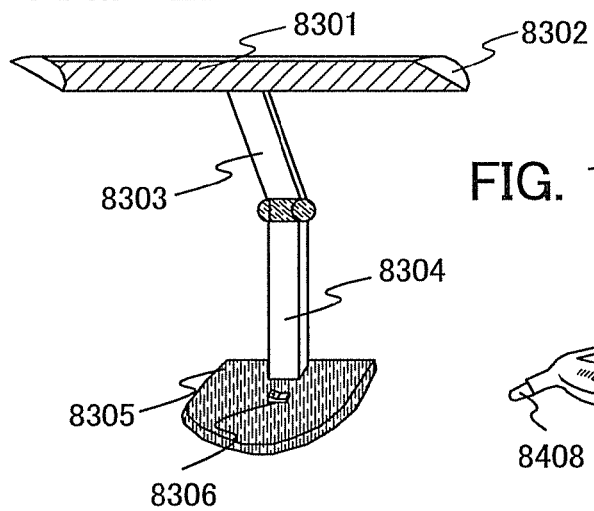

FIG. 12D illustrates a desk lamp including a lighting portion 8301, a shade 8302, an adjustable arm 8303, a support 8304, a base 8305, and a power supply switch 8306. This desk lamp is manufactured using a light-emitting device according to one embodiment of the present invention in the lighting portion 8301. Note that the term 'lighting appliance' also encompasses ceiling lights, wall lights, and the like. With application of one embodiment of the present invention, deterioration of a material in film formation is prevented and pattern can be formed with high accuracy. Therefore, a desk lamp with high definition, high light-emitting characteristics, and the long lifetime can be provided.

Figure 12E:
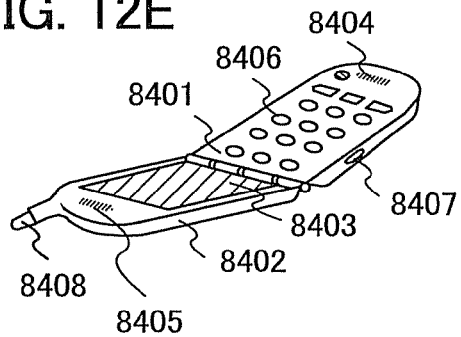

FIG. 12E illustrates a cellular phone including a main body 8401, a housing 8402, a display portion 8403, an audio input portion 8404, an audio output portion 8405, operation keys 8406, an external connection port 8407, an antenna 8408, and the like. This cellular phone is manufactured using a light-emitting device according to one embodiment of the present invention in the lighting portion 8403. With application of one embodiment of the present invention, deterioration of a material in film formation is prevented and pattern can be formed with high accuracy. Therefore, a cellular phone with high definition, high light-emitting characteristics, and the long lifetime can be provided.

Figure 13A:
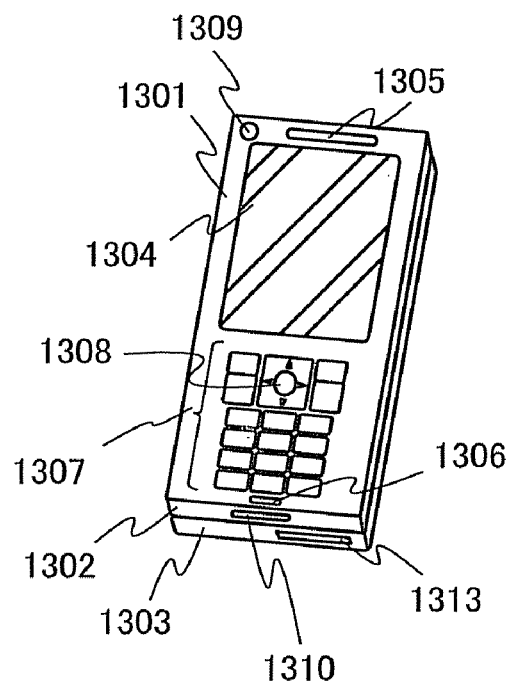
FIGS. 13A to 13C are views illustrating an electric device.
Figure 13B:
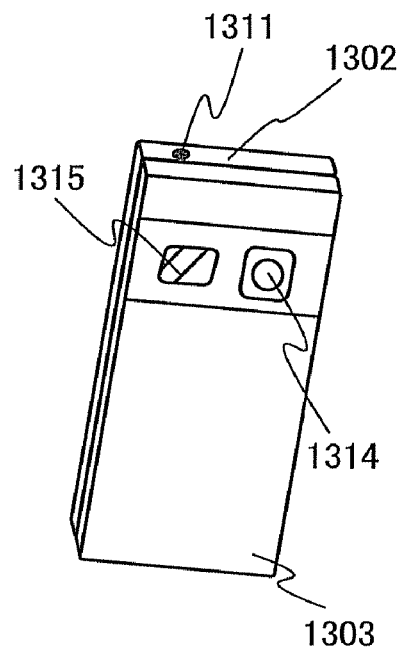
Figure 13C:
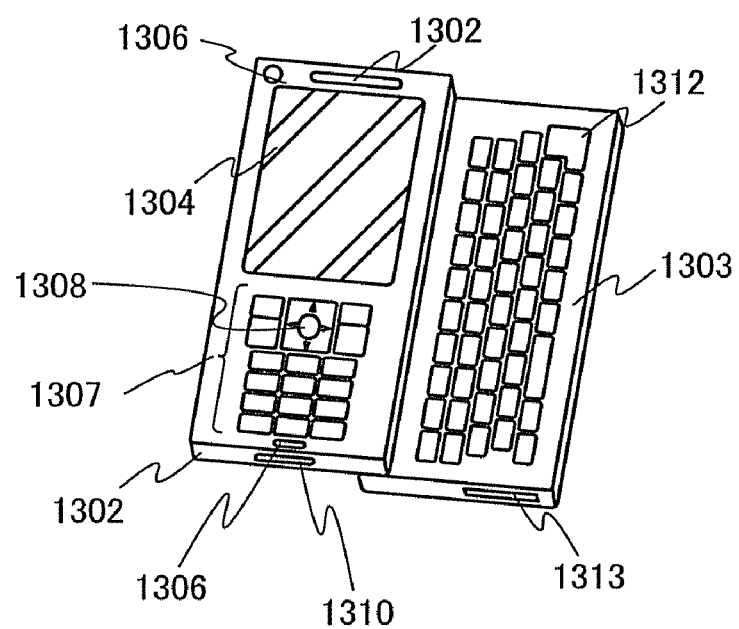

FIG. 13A also illustrate a cellular phone and FIG. 13A is a front view, FIG. 13B is a rear view, and FIG. 13C is a development view. A main body 1301 is a so-called smartphone which has both functions of a cellular phone and a portable information terminal, and incorporates a computer and can process a variety of data processing in addition to voice calls.

The main body 1301 includes two housing: a housing 1302 and a housing 1303. The housing 1302 includes a display portion 1304, a speaker 1305, a microphone 1306, operation keys 1307, a pointing device 1308, a camera lens 1309, an external connection terminal 1310, an earphone terminal 1311, and the like, while the housing 1303 includes a keyboard 1312, an external memory slot 1313, a camera lens 1314, a light 1315, and the like. In addition, an antenna is incorporated in the housing 1302.

Further, in addition to the above structure, the smartphone may incorporate a non-contact IC chip, a small size memory device, or the like.

In the display portion 1304, the display device described in the above embodiment can be incorporated, and display direction can be changed depending on a usage pattern. Since the camera lens 1309 is provided in the same surface as the display portion 1304, the cellular phone can be used as a videophone. Further, a still image and a moving image can be taken with the camera lens 1314 and the light 1315 using the display portion 1304 as a viewfinder. The speaker 1305 and the microphone 1306 are not limited to use for verbal communication, and can be used for a videophone, recording, reproduction, and the like.

With the use of operation keys 1307, making and receiving calls, inputting simple information of e-mails or the like, scrolling of the screen, moving the cursor and the like are possible. In addition, the housings 1302 and 1303 overlap with each other (FIG. 13A) slide and can be developed as illustrated in FIG. 13C, so that the cellular phone can be used as a portable information terminal. In this case, smooth operation can be conducted by using the keyboard 1312 or the pointing device 1308. The external connection terminal 1310 can be connected to an AC adapter and various types of cables such as a USB cable, and charging and data communication with a personal computer are possible. Furthermore, a large amount of data can be stored and moved by inserting a recording medium into the external memory slot 1313.

Further, in addition to the aforementioned functions, the cellular phone may also have an infrared communication function, a television reception function, or the like.

Note that the aforementioned cellular phone is manufactured using a light-emitting device which is formed according to one embodiment of the present invention in the display portion 1304. With application of one embodiment of the present invention, deterioration of a material in film formation is prevented and pattern can be formed with high accuracy. Therefore, a cellular phone with high definition, high light-emitting characteristics, and the long lifetime can be provided.

As described above, an electronic device or a lighting device can be obtained by using the light-emitting device according to one embodiment of the present invention. The applicable range of the light-emitting device according to one embodiment of the present invention is so wide that the light-emitting element can be applied to electric devices of every field.

Note that the structure in Embodiment 7 can be combined with a structure in any of Embodiments 1 to 6 as appropriate.

This application is based on Japanese Patent Application serial no. 2008-103425 filed with Japan Patent Office on Apr. 11, 2008, the entire contents of which are hereby incorporated by reference.

What is claimed is:

1. A method for manufacturing a light-emitting device, comprising the steps of:
    forming a reflective layer having an opening portion over one surface of a first substrate;
    forming a light absorption layer so as to be in contact with the first substrate and the reflective layer;
    forming a material layer so as to be in contact with the light absorption layer;
    removing a first part of the material layer by performing irradiation on the opposite surface of the first substrate with first light wherein the first part of the material layer overlaps with the opening portion of the reflective layer; and
    evaporating a second part of the material layer onto a second substrate by performing irradiation on the opposite surface of the first substrate with second light wherein the second part of the material layer overlaps with the reflective layer.

2. A method for manufacturing a light-emitting device, according to claim 1,
    wherein the irradiation of the first light is performed in a range of a general formula (1):

$$1/(A_1)^{1.5} \leq B_1 \leq 10^6/(A_1)^{1.5} \text{ and } B_1 \leq 10^{-3} \quad (1)$$

where light intensity is $A_1$ (W/cm$^2$) and irradiation time is $B_1$ (s), and
    wherein the irradiation of the second light is performed in a range of a general formula (2):

$$1/(A_2)^{1.5} \leq B_2 \leq 10^6/(A_2)^{1.5} \text{ and } B_2 > 10^{-3} \quad (2)$$

where light intensity is $A_2$ (W/cm$^2$) and irradiation time is $B_2$ (s).

3. The method for manufacturing a light-emitting device, according to claim 1, wherein the first light is a laser light and the second light is a lamp light.

4. The method for manufacturing a light-emitting device, according to claim 1, wherein the reflectance of the reflective layer is greater than or equal to 85% with respect to light.

5. The method for manufacturing a light-emitting device, according to claim 1, wherein the reflective layer contains any of aluminum, silver, gold, platinum, copper, an alloy containing aluminum, and an alloy containing silver.

6. The method for manufacturing a light-emitting device, according to claim 1, wherein the reflectance of the light absorption layer is less than or equal to 70% with respect to light.

7. The method for manufacturing a light-emitting device, according to claim 1, wherein the light absorption layer contains any of tantalum nitride, titanium nitride, chromium nitride, manganese nitride, titanium, and carbon.

8. The method for manufacturing a light-emitting device, according to claim 1, wherein the material layer is formed from an organic compound.

9. The method for manufacturing a light-emitting device, according to claim 1, wherein the material layer contains one or both of a light-emitting material and a carrier-transporting material.

10. A method for manufacturing a light-emitting device, comprising the steps of:
    forming a reflective layer having an opening portion over one surface of a first substrate;
    forming a light absorption layer so as to be in contact with the first substrate and the reflective layer;
    forming a material layer so as to be in contact with the light absorption layer;
    removing a first part of the material layer by performing irradiation on the opposite surface of the first substrate with first light wherein the first part of the material layer overlaps with the opening portion of the reflective layer; and
    evaporating a second part of the material layer onto a second substrate by heating the first substrate wherein the second part of the material layer overlaps with the reflective layer.

11. A method for manufacturing a light-emitting device, according to claim 10,
    wherein the irradiation of the first light is performed in a range of a general formula (1):

$$1/(A_1)^{1.5} \leq B_1 \leq 10^6/(A_1)^{1.5} \text{ and } B_1 \leq 10^{-3} \quad (1)$$

where light intensity is $A_1$ (W/cm$^2$) and irradiation time is $B_1$ (s).

12. The method for manufacturing a light-emitting device, according to claim 10, wherein the first light is a laser light.

13. The method for manufacturing a light-emitting device, according to claim 10, wherein the reflectance of the reflective layer is greater than or equal to 85% with respect to light.

14. The method for manufacturing a light-emitting device, according to claim 10, wherein the reflective layer contains any of aluminum, silver, gold, platinum, copper, an alloy containing aluminum, and an alloy containing silver.

15. The method for manufacturing a light-emitting device, according to claim 10, wherein the reflectance of the light absorption layer is less than or equal to 70% with respect to light.

16. The method for manufacturing a light-emitting device, according to claim 10, wherein the light absorption layer contains any of tantalum nitride, titanium nitride, chromium nitride, manganese nitride, titanium, and carbon.

17. The method for manufacturing a light-emitting device, according to claim 10, wherein the material layer is formed from an organic compound.

18. The method for manufacturing a light-emitting device, according to claim 10, wherein the material layer contains one or both of a light-emitting material and a carrier-transporting material.

19. A method for manufacturing a light-emitting device, comprising the steps of:
- forming a metal film over one surface of a first substrate;
- etching the metal film to form a reflective pattern;
- forming a light absorption layer so as to be in contact with the first substrate and the reflective layer;
- forming a material layer so as to be in contact with the light absorption layer;
- removing a first part of the material layer by performing irradiation on the opposite surface of the first substrate with first light wherein the first part of the material layer does not overlap with the reflective pattern; and
- evaporating a second part of the material layer onto a second substrate by performing irradiation on the opposite surface of the first substrate with second light wherein the second part of the material layer overlaps with the reflective pattern.

20. A method for manufacturing a light-emitting device, comprising the steps of:
- forming a metal film over one surface of a first substrate;
- etching the metal film to form a reflective pattern;
- forming a light absorption layer so as to be in contact with the first substrate and the reflective layer;
- forming a material layer so as to be in contact with the light absorption layer;
- removing a first part of the material layer by performing irradiation on the opposite surface of the first substrate with first light wherein the first part of the material layer does not overlap with the reflective pattern; and
- evaporating a second part of the material layer onto a second substrate by heating the first substrate wherein the second part of the material layer overlaps with the reflective pattern.

* * * * *